US012658673B2

(12) United States Patent
Zhou et al.

(10) Patent No.: US 12,658,673 B2
(45) Date of Patent: Jun. 16, 2026

(54) HIGH SPEED SPATIAL LIGHT MODULATOR

(71) Applicant: Board of Regents, The University of Texas System, Austin, TX (US)

(72) Inventors: Weidong Zhou, Southlake, TX (US); Mingsen Pan, Arlington, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 994 days.

(21) Appl. No.: 17/815,339

(22) Filed: Jul. 27, 2022

(65) Prior Publication Data

US 2023/0053851 A1 Feb. 23, 2023

Related U.S. Application Data

(60) Provisional application No. 63/226,262, filed on Jul. 28, 2021.

(51) Int. Cl.
| | |
|---|---|
| *H01S 5/183* | (2006.01) |
| *H01S 5/042* | (2006.01) |
| *H01S 5/062* | (2006.01) |
| *H01S 5/11* | (2021.01) |

(52) U.S. Cl.
CPC ...... *H01S 5/18302* (2013.01); *H01S 5/04253* (2019.08); *H01S 5/04254* (2019.08); *H01S 5/04256* (2019.08); *H01S 5/06243* (2013.01); *H01S 5/06246* (2013.01); *H01S 5/11* (2021.01); *H01S 5/18375* (2013.01)

(58) Field of Classification Search
CPC ............... G02F 1/0151; H01S 5/06243; H01S 5/18319; H01S 5/18302
See application file for complete search history.

(56) References Cited

U.S. PATENT DOCUMENTS

| | | | | |
|---|---|---|---|---|
| 6,054,335 A | * | 4/2000 | Sun | H01S 5/18308 310/40 MM |
| 2021/0305777 A1 | * | 9/2021 | Lee | H01S 5/0651 |

OTHER PUBLICATIONS

Fourouzmand, "Tunable all-dielectric metasurface for phase modulation of the reflected and transmitted light via permittivity tuning of indium tin oxide," 2019, Nanophotonics, 8(3), p. 415-427 and Supplementary Material p. 1-32. (Year: 2019).*

* cited by examiner

*Primary Examiner* — Michael Carter
(74) *Attorney, Agent, or Firm* — Thomas I Horstemeyer, LLP

(57) ABSTRACT

A high speed spatial light modulators are described. In one non-limiting example, an optical phased array structure comprises a vertical cavity surface-emitting laser (VCSEL) that provides a light beam and a phase delay unit that includes a bi-layer photonic crystal slab. The bi-layer photonic crystal slab (PCS) is attached to the VCSEL and comprises two silicon PCS layers separated by a dielectric layer. The optical phased array structure is configured to control a direction of the light beam by a voltage applied to the phase delay unit. By incorporating a dispersive layer (e.g. graphene), the absorption of the structure can be modulated and accordingly the reflection of the surface can be modulated as well.

10 Claims, 20 Drawing Sheets

PDU: Phase Delay Unit

VCSEL (d)

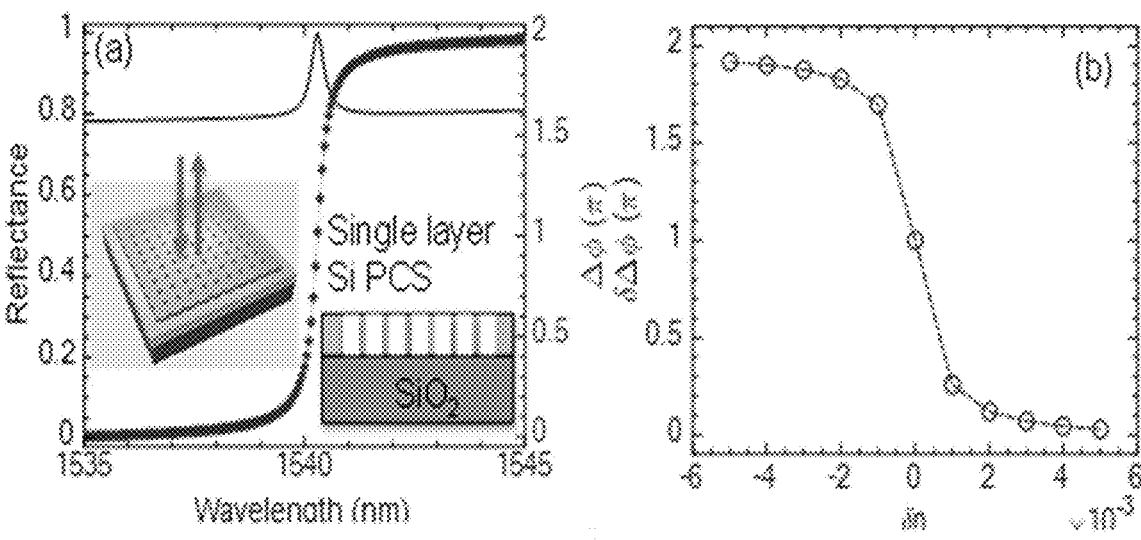
FIG. 3A
FIG. 3B
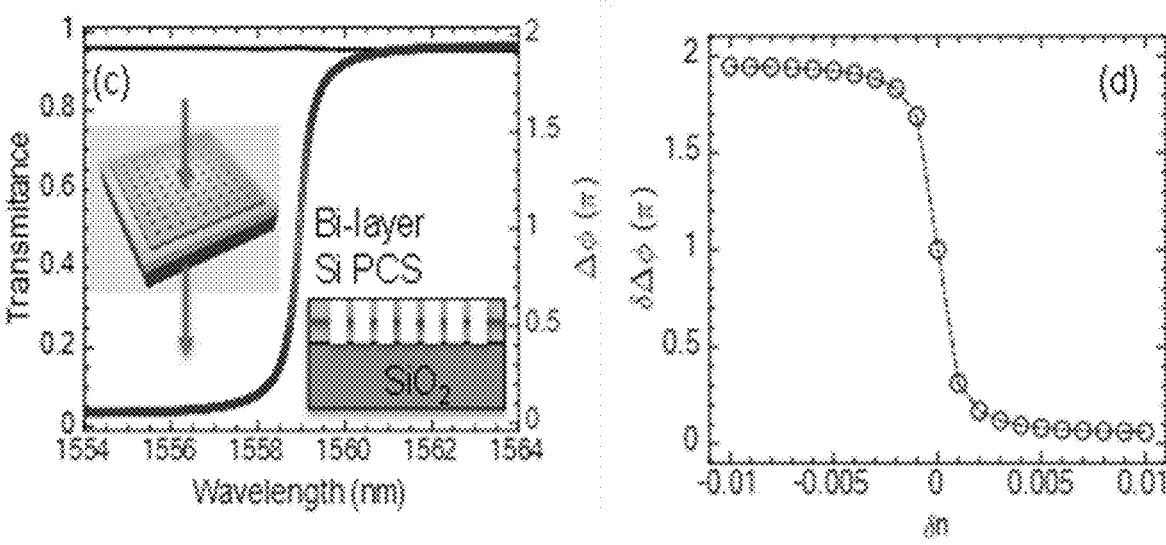
FIG. 3C
FIG. 3D

| Merits | Thermal | Liquid Crystal | Chemical potential | Electro-optical |
|---|---|---|---|---|
| Mechanism | Thermo-optical index change; temperature-induced phase change. | Electrical field-induced birefringence and anisotropy. | Energy band manipulation for absorption tuning at certain wavelength, such as graphene. | Charge-induced refractive index change. |
| Scalability | ✓ | ✓ | ✓ | ✓ |
| GHz Speed | ✗ | ✗ | N.A. | ✓ |
| Integration and compactness | ✗ | ✗ | ✓ | ✓ |
| Reflection/absorption switching | ✓ | N.A. | N.A. | ✓ |
| Reliability | N.A. | N.A. | N.A. | ✓ |

$$ER = 10\log\left(\frac{R_{on}}{R_{off}}\right);$$

HIGH SPEED SPATIAL LIGHT MODULATOR

CROSS REFERENCE TO RELATED APPLICATIONS

This application claims priority to, and the benefit of, U.S. Provisional Application No. 63/226,262, filed Jul. 28, 2021 and entitled "High Speed Spatial Light Modulator," which is incorporated by reference herein in its entirety.

STATEMENT REGARDING FEDERALLY SPONSORED RESEARCH OR DEVELOPMENT

This invention was made with government support under grant numbers FA9550-16-1-0010 awarded by the Air Force Office of Scientific Research. The government has certain rights in the invention.

This invention was made with government support under grant number W911NF1910108 awarded by the Army Research Office. The government has certain rights in the invention.

BACKGROUND

Automotive Light Detection and Ranging (LiDAR) has proved to be a useful technology for autonomous vehicles due to high precision and accurate real-time detection from the scanning laser devices. However, the technology's performance and cost hinder its applicability to other applications. Compared to traditional mechanical rotating or MEMS based scanning LiDAR systems, optical phased array (OPA) based approaches offer significant advantages in scanning speed, size, reliability, and cost. However, most OPAs are waveguide-based, requiring complicated in-plane beam routing, optical assembly, and optical compensation techniques, to integrate with external lasers.

On the other hand, Vertical cavity surface-emitting lasers (VCSELs) are intrinsically low cost and scalable in 2D, with better spectral temperature stability and reliability. Low power VCSELs have already become the dominant emitter choice for flash LiDAR (no beam steering requirement) and 3D sensing applications in mobile devices where the sensing distance is very short. As such, there is a technology gap for reliable, compact and high-speed scanning LiDAR products with a simple integration process for low cost manufacturing.

BRIEF DESCRIPTION OF THE DRAWINGS

Many aspects of the present disclosure can be better understood with reference to the following drawings. The components in the drawings are not necessarily to scale, with emphasis instead being placed upon clearly illustrating the principles of the disclosure. Moreover, in the drawings, like reference numerals designate corresponding parts throughout the several views.

FIGS. 3A through 3D illustrate tuning design examples, according to one embodiment described herein.

FIG. 9 is a table that comparison absorption switching technologies, according to one embodiment described herein.

DETAILED DESCRIPTION

Figures 1A, 1B, 1C:
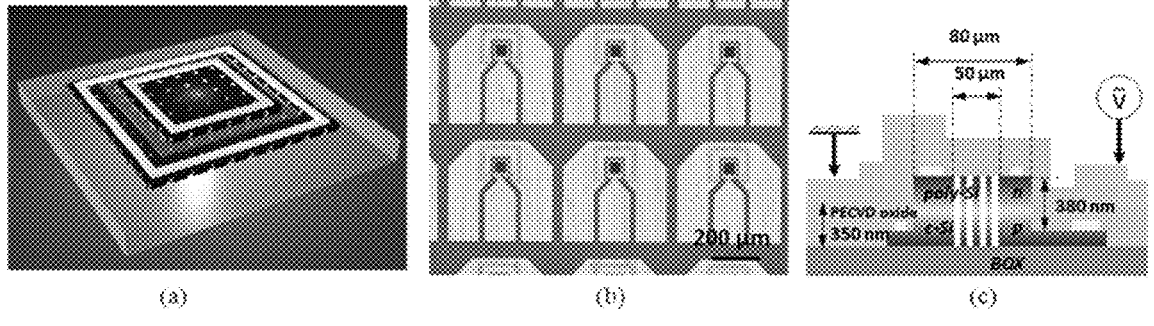
FIGS. 1A through 1F illustrate various images for Bi-layer photonic crystal high speed spatial light modulators, according to one embodiment described herein.

Automotive Light Detection and Ranging (LiDAR) has proven to be useful technology for autonomous vehicles due to high precision and accurate real-time detection from the scanning laser devices. However, the technology's performance and cost hinder its applicability to other applications. Compared to traditional mechanical rotating or MEMS based scanning LiDAR systems, optical phased array (OPA) based approaches offer significant advantages in scanning speed, size, reliability, and cost. However, most OPAs are waveguide-based, requiring complicated in-plane beam routing, optical assembly, and optical compensation techniques, to integrate with external lasers.

On the other hand, Vertical cavity surface-emitting lasers (VCSELs) are intrinsically low cost and scalable in 2D, with better spectral temperature stability and reliability. Low power VCSELs have already become the dominant emitter choice for flash LiDAR (no beam steering requirement) and 3D sensing applications in mobile devices where the sensing distance is very short.

There is a technology gap for reliable, compact and high-speed scanning LiDAR products with simple integration process for low cost manufacturing. Such technology can find applications in autonomous vehicles, unmanned aerial vehicles (UAVs), robotics, machine vision, survey, industrial process control, 3D holography for visible-light displays (e.g. Augmented Reality), free-space optical communications, and trapped-ion quantum computing.

Beam steering technology is currently a mechanical system that includes a rotating mirror, which can make the system large, costly, and unstable. MEMS (micro-electro-mechanical systems) mirrors have been employed for size and cost reduction, but there is a trade-off between the size, beam divergence (or resolution), and speed. MEMS-based Digital Micromirror Device (DMD) or DM technology, can operate at kHz to low MHz range. Therefore, complete non-mechanical (solid-state) devices have been sought. Liquid crystal on Silicon (LCoS) is the most mature technology used for spatial light modulators (SLMs), which showcases several advantages such as no moving parts, low power consumption, and established manufacturing processes. Nonetheless, nematic liquid crystals (LCs), which are most commonly used, suffer from a slow speed (<1 kHz). Ferroelectric LCs show a speed of 2 kHz, but operate only in a binary phase modulation due to the material's bistable nature. Stressed LCs can provide a sub-millisecond control with continuous phase modulation; however, their mass production is not feasible due to a delicate mechanical shearing process.

Optical phased arrays (OPAs) have been developed extensively for this purpose. Large scale 64×64 OPAs with a small footprint (~0.36 mm$^2$) have been achieved. 512 element OPAs were also reported with 2D beam steering capabilities at a speed of <100 kHz. In all these approaches, off-chip lasers are commonly considered with OPAs mostly based on in-plane waveguiding beam routing schemes, which is limited for 2D scalability. Recently, a monolithically integrated OPAs were reported based on LC based OPAs directly processed on VCSEL arrays. This demonstration suggests the feasibility of such a monolithic integration scheme with potential in high reliability and low cost.

The advances in nanophononics and integrated photonic technologies offer new opportunities to address these grand challenges in adaptive optics by offering potentially compact, high speed, and high performance reconfigurable metasurfaces and SLMs with capabilities of amplitude and phase modulations. Based on subwavelength gratings, it has been reported that an active antenna comprising a free-space coupled asymmetric Fabry-Perot resonator produces a phase-dominant thermo-optic modulation of reflected light at frequencies approaching tens of kilohertz. Complete 2 phase tuning was possible at a speed of 14 kHz was achieved with thermal tuning. Based on coupled bi-layer photonic crystal slabs (PCS) and free-carrier injection inducted index changes, a 200 MHz high speed spatial light (amplitude) modulator on silicon was reported. The PCS structure is intrinsically 2D scalable for direct integration with VCSEL and VCSEL arrays, resulting in functional structures for OPAs and SLMs.

The integrated modular solution of fast OPAs with low cost VCSELs can result in simplified optical design and assembly for fast, compact, and reliable LiDAR applications. It can fill the technology gap by bridging proven VCSEL technology in 3D sensing with innovative OPA structure.

Advances in nanophotonics and integrated photonic technologies offer new opportunities to address these grand challenges in scanning LiDAR technology. It can provide compact, high speed, and high performance reconfigurable metasurfaces and photonic crystal slabs (PCSs) with capabilities of amplitude and phase modulations. Recently, it was discovered that abrupt full $2\pi$ phase transition capabilities in these single and bi-layer PCS structures.

These results show great promise on high speed large angle beam steering and high speed SLMs at low bias voltages. The embodiments of the present disclosure relate to advancing this technology toward a high scanning speed beam steering OPA structure capable of full $2\pi$ phase control at 1 GHz speed and above. The structure can be co-designed and co-packaged, built directly on high power VCSEL arrays. The various embodiments of the present disclosure has the several advantages over the exiting field. Some non-limiting examples of advantages include:

High speed: The structure can operate at GHz regime, which will be 2-3 orders of magnitude faster than other approaches.

Reliable: The structure is based on co-design and co-packaging of OPAs with VCSELs with simplified optical beam routing schemes and mechanical integration structures.

Scalable: The proposed structure architecture is planar, CMOS compatible, spectral and spatial scalable, which ensures its manufacturing scalability and device pixel scalability.

Coupled bi-layer structures are sensitive to small variations in the spacing between the two PCS, lattice alignment, and material refractive index changes on both dielectric layers. This diversity of control mechanisms enables opportunities and applications such as tunable optical high-Q filters, ultra-sensitive molecular and biochemical sensors, optomechanical devices, fast optical switching, and electro-optical modulation. Due to its small size and PCS-based planar structure, this architecture lends itself naturally to an array of modulator pixels.

Figures 1D, 1E, 1F:
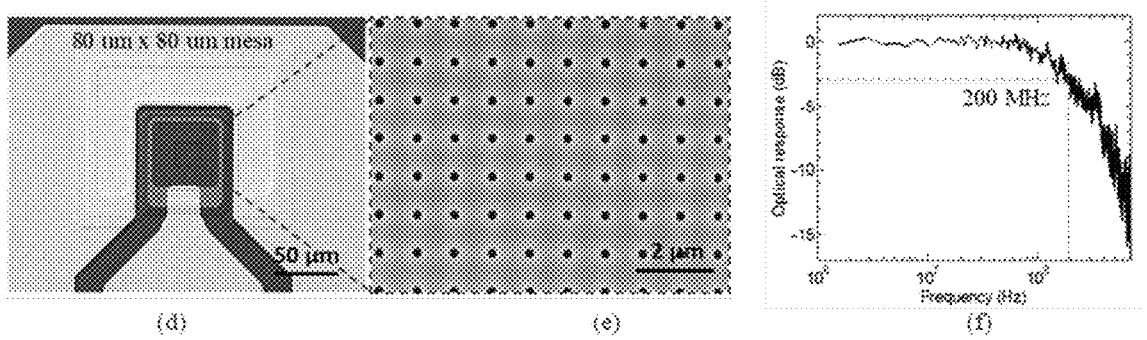

The various embodiments are capable of demonstrating a high speed ultra-compact electro-optic modulator exploiting a Fano resonance in a coupled bi-layer PCS structure (see e.g., FIG. 1). FIG. 1 Bi-layer photonic crystal high speed spatial light modulators (SLMs): (a) Schematic of single SLM pixel with top and bottom ring contacts; (b) Micrograph of fabricated SLM array; (c) Cross-sectional view of the SLM with bi-layer capacitively coupled p-i-n layers; (d) SEM top view of single pixel SLM with 80 um mesa; (e) Zoom-in of the photonic crystal structure; and (f) Modulation frequency response with a 3 dB bandwidth of 200 MHz.

The present disclosure describes the fabrication of two kinds of 6×6 membrane device arrays on silicon-on-insulator (SOI) wafer, with square-shaped PCS pattern lateral sizes of 300 μm and 50 μm, respectively. A 200 MHz modulation bandwidth, limited by the parasitic RC time constant, was obtained on individual devices with a 50 μm PCS pattern area on the 80 μm mesa. Further shrinking the device's lateral size will reduce the intrinsic RC time constant for gigahertz speed modulations. While the demonstration presented in the present disclosure concerns modulation of the reflection, a straightforward modification of the design would enable it to be used in a transmission mode as well. These coupled bi-layer PCS-based modulators are transferable, stackable, bondable, and CMOS compatible. With their small footprint and convenience of 2D array, they offer a multitude of opportunities for 30 photonic integration and spatial light manipulation.

The overall objective is the demonstration of a fast steering speed 2D optical phased arrays (OPAs) directly integrated with high power VCSELs, with steering speed on the order of 1 GHz, which is a few orders of magnitude faster than the state of the art.

Figures 2A, 2B:
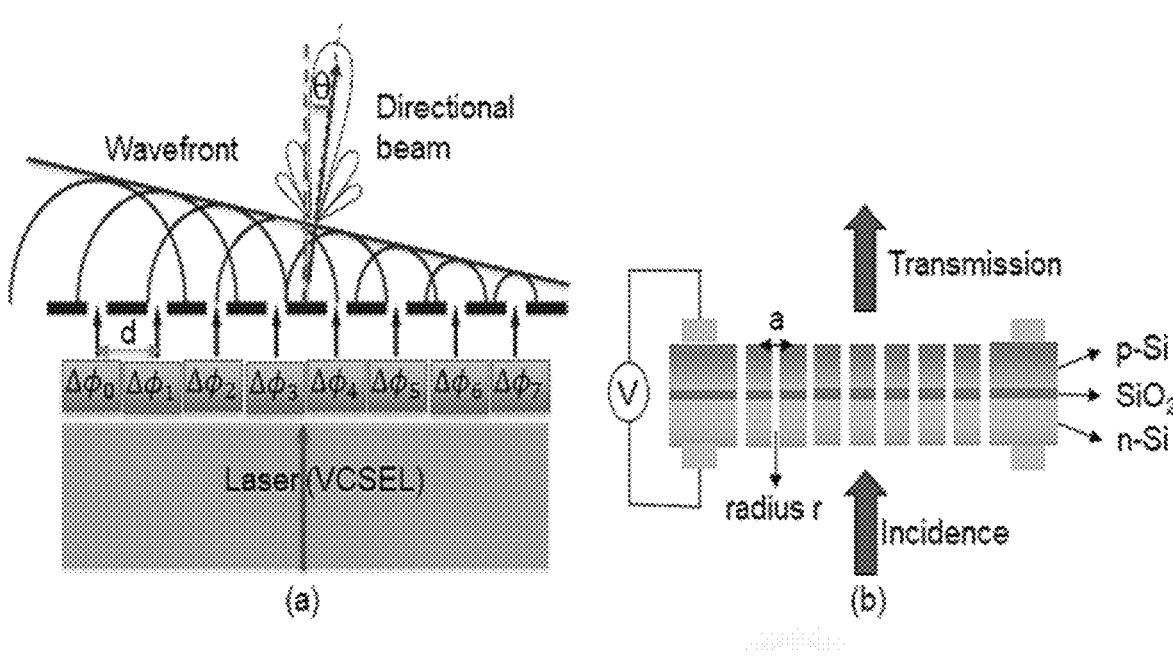
FIGS. 2A through 2D illustrate various images of optical phased array with a vertical cavity surface-emitting lasers, according to one embodiment described herein.

A non-limiting example embodiment of the proposed structure is shown in FIG. 2. FIG. 2 illustrates a Fast 2D Optical Phased Arrays (OPAs) Integrated Directly on High Power VCSELs): (a) Optical phased array principle consisting of phase delay unit (PDU) integrated with laser (VC-SEL); (b) 3D illustration of the complete 2D beam steerable VCSELs; (c) Basic single pixel PDU with coupled bi-layer photonic crystal slabs (PCSs), which consist of top p-Si and bottom n-Si PCSs, with an ultra-thin SiO$_2$ buffer layer in between; and (d) A 3D illustration of single pixel, along with single (top) and overlaid (bottom) far-field radiation patterns for various steering angles.

Figures 2C, 2D:
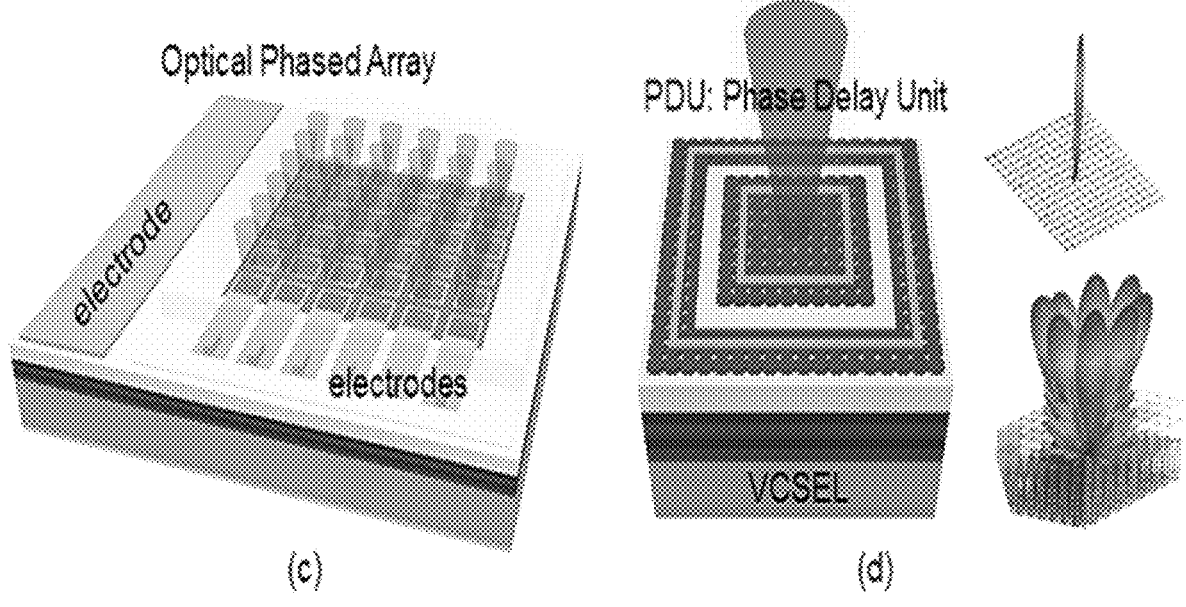

In some embodiments, to construct a 2D OPA directly on VCSELs, programmable phase delays are generated for the desired beam steering angles, as shown in FIG. 2 (a, b). The basic phase tuning structure is a coupled bi-layer photonic crystal slab (PCS), as shown in in FIG. 2(c), which consists of two silicon (Si) PCS layer separated by a very thin layer of dielectric layer (e.g. SiO$_2$, or other electro-optical materials). Based on the coupled mode theory, it can be found that for each Fano resonance, a drastic phase change (0 to 2π) occurs in such PCS cavities. Based on electrical control of the optical refractive index of Si layers, phase of the transmitted light at certain wavelength can be controlled at high speed. A single pixel is also shown in FIG. 2(d), along with far-field radiation patterns for various steering angles. Similarly, reflective OPAs can also be constructed.

The proposed structure has a few innovative features such as high speed, reliable, compact, spectral and spatial scalable, and low cost for volume productions. However, there are a few major technical barriers related to the proposed approach which we hope to address during this project:

Trade-offs between speed and tuning range: While it is possible to operate the proposed OPAs at GHz and above with optimal design, the tuning depth in phase (phase change rate) may need to be optimized to achieve the desired performance. Such a trade-off may set a limit on the maximum speed the device can operate.

Scaling limit in pixel size. There is a strong correlation between cavity quality and lattice periods when the photonic crystal cavity is scaled to few periods. Said correlation may also impact the phase change slope, resulting in higher bias voltage needed to achieve full 2π phase shift. Additionally, grating lobes appear if the pixel size is not sub-wavelength. The present disclosure includes an investigation of gradient laterally confined photonic crystal concept and trade-offs in lattice periods, phase change slope, and radiation lobe control.

Beam coupling and shaping. The intimate integration of VCSELs can simplify optical alignment and assembly requirements, resulting in high reliability and lower cost. However, beam engineering could be a trade-off task to be considered. The divergence angles of laser beam and interaction with PCS OPA will impact the wavefront beam continuity and far-field radiation patterns. The present disclosure includes an investigation of the VCSEL beam control and its relations on steering beam qualities.

Transmissive or reflective OPAs. One of the advantages with the proposed PCS OPA structure is the design flexibilities in both transmissive and reflective OPAs with full 2π phase control capabilities. The system requirement will largely determine the selection of transmissive vs. reflective OPAs. The present disclosure includes an investigation of a single element and few pixel OPA structures in the proposed research, integrated with VCSELs, based on transmissive OPA designs. However, reflective OPA structures may be considered towards the end of the project, potentially a standalone unit with integrated ROIC electronics for pixel array size scaling.

Proposed Structure 1: Phase delay in Fano resonance membrane reflectors. In addition to high Q narrow band filters, the present disclosure includes an investigation of broadband membrane reflectors (MRs) based on Fano resonance PCS. A detailed analysis was carried out on the phase transition in Fabry-Perot cavities based on two single layer PCS based membrane reflectors, where a 2π phase shift occurs at cavity resonance. By tuning the index of Si (~0.08), a full 2π phase shift in such cavities can also be achieved.

The phase shifts in both PCS filters and MRs suggest we can design PCS structures with 2π phase transition/tuning in reflection and transmission modes. Shown in FIG. 3(a) is an example for a reflection mode design based on single layer Si PCS, where 2π phase shift can be achieved with index tuning of 0.01 (FIG. 3(b)). A transmission mode design example is shown in FIG. 3 (c, d), where a bi-layer PCS structure was considered with a 20 nm SiO$_2$ layer sandwiched in between two Si PCS layers 2π phase shift can be achieved with index tuning of 0.02. As such, the SiO$_2$ layer (i.e., dielectric layer) can have a thickness in a range between 10 nm and 25 nm.

It is worth noting that, for the reflection mode design, 99% to 100% broadband reflectivity has been achieved in some embodiments for the demonstration of MR-VCSELs on Si. However, the example design shown in FIG. 3(a) achieved close to 100% reflectivity only at a narrow spectral band. Such design is sufficient for OPA applications where specific lasing wavelengths are considered. However, broader spectral coverage may be needed for broadband spectral application cases such as SLMs for imaging applications. Further detailed investigations are needed to optimize the design in terms of spectral bandwidth and phase transition to expand upon potential commercial applications.

Design 2: Design of Si bi-layer coupled photonic crystal cavities for full phase tuning: The basic idea of the single pixel OPA element discussed here is illustrated in FIG. 2(c). Two thin (~200 nm) Si PCSs, separated by a thin layer of SiO$_2$ (20 nm in this case). The Si PCSs are P- and N-doped, with the oxide layer providing electrical isolation between them. The resonance can be excited by surface-normal incident light, and the resulting field distribution can be calculated using rigorous coupled-wave (RCWA) analysis. Electrical coupling is enabled by the plasma dispersion effect, in which the concentration of free carriers in silicon changes the real and imaginary parts of the refractive index. This mechanism was studied extensively in silicon. When a potential difference is imposed between the slabs, the accompanying charge accumulation changes their refractive indices, modifying the high-C) mode's optical frequency. For a fixed optical frequency, the transmission and reflection are affected, with slope efficiency proportional to the optical quality factor. We modeled our device's electrical response was modeled using Taurus Medic (Synopsys). For the high speed SLMs reported earlier (FIG. 1), the simulation shows that the free carrier concentrations in Si near the Si/SiO$_2$ interfaces are strongly modified by electrical carrier injection, resulting in significant local refractive index change. A larger index change ($\Delta n>0.06$) can be obtained in thinner oxide case due to carriers concentrating in a much smaller volume. Thinner oxide such as 10 nm induces higher absorption, which causes factors to drop in optical simulation. Thus an optimized 20 nm SiO$_2$ thickness was applied for further electrical examinations. Additional simulations on temporal responses suggest intrinsic modulation speed can be 10 GHz and above. Based on these results, we demonstrated 200 MHz amplitude modulation under reflection mode, a record high speed for SLMs (FIG. 1). The parasitic RC constants associated with large 80 mm device size limit the maximum modulation speed demonstrated here.

Figure 4:
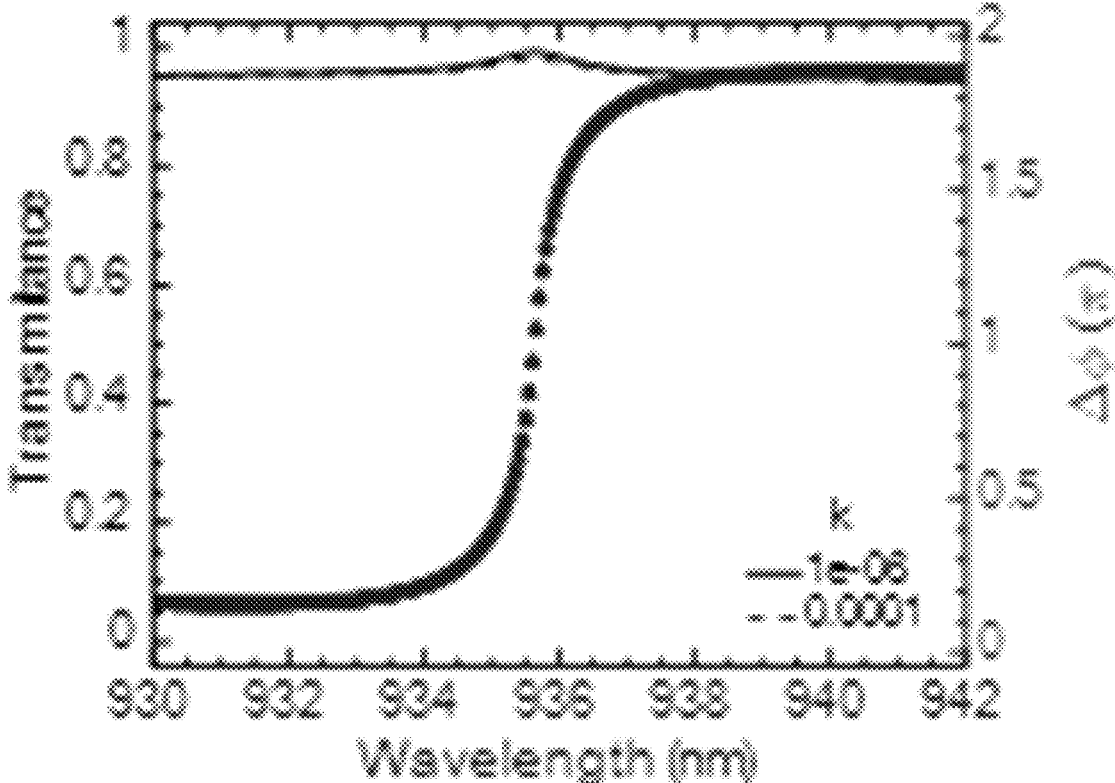
FIG. 4 illustrates an exemplary bi-layer design, according to one embodiment described herein.

For OPA operating at shorter wavelengths (940 nm), we replace crystalline Si with hydrogenated amorphous Si (a-Si: H), which has been extensively investigated for low cost solar cells and led to the successful large scale commercialization by multiple vendors. By controlling the deposition process, optimal bandgap and absorption properties can be achieved to absorb either blue band or green band solar radiations for single or multijunction a-Si:H thin film photovoltaics (TFPVs). At 940 nm, a-Si:H is transparent with its extinction coefficient is $5.5\times10^{-6}$, more than two orders of magnitude smaller than that value for c-Si (k~0.001). Based on these parameters, a preliminary design is shown in FIG. 4, where $2\pi$ phase shift can also be achieved, with transmittance over 95% across the wide spectral range (930-942 nm).

Additionally, a-Si:H has been explored for integrated photonics applications, where GHz modulation speed was also feasible based on plasma dispersion effect. Another advantage of using a-Si:H is that it can be deposited with low temperature CVD process, compatible with the CMOS process, and can be carried out on the processed VCSEL chips. Since it is a widely used materials for low cost solar cells, it is ideal for the proposed OPA designs for LiDAR applications.

However, while most research has been focused on either in the visible spectral band (For TFPVs) or 1550 nm wavelength band (For integrated photonics), few works have reported using a-Si:H for low cost LiDAR applications at 850-1040 nm spectral band, where Si based detectors can be used. The bandgap engineering and optimization for a-Si:H TFPVs provides an excellent opportunity for a-Si:H for LiDAR applications due to its low absorption properties in the 830-1200 nm spectral band. We will work on LPCVD deposition process optimization to form trilayer a-Si/SiO$_2$/a-Si structure in our cleanroom. We will also consider single layer p-i-n PCS structure based on commercial a-Si:H TFPV processes for even further simplified process controls. We will further optimize our design for optimal phase tuning at 940 nm. Issues to be addressed include the doping control of the p-i-n structures for the desired refractive index changes under different bias voltages; pixel dimension optimization for high extinction and high speed.

Figure 5A:
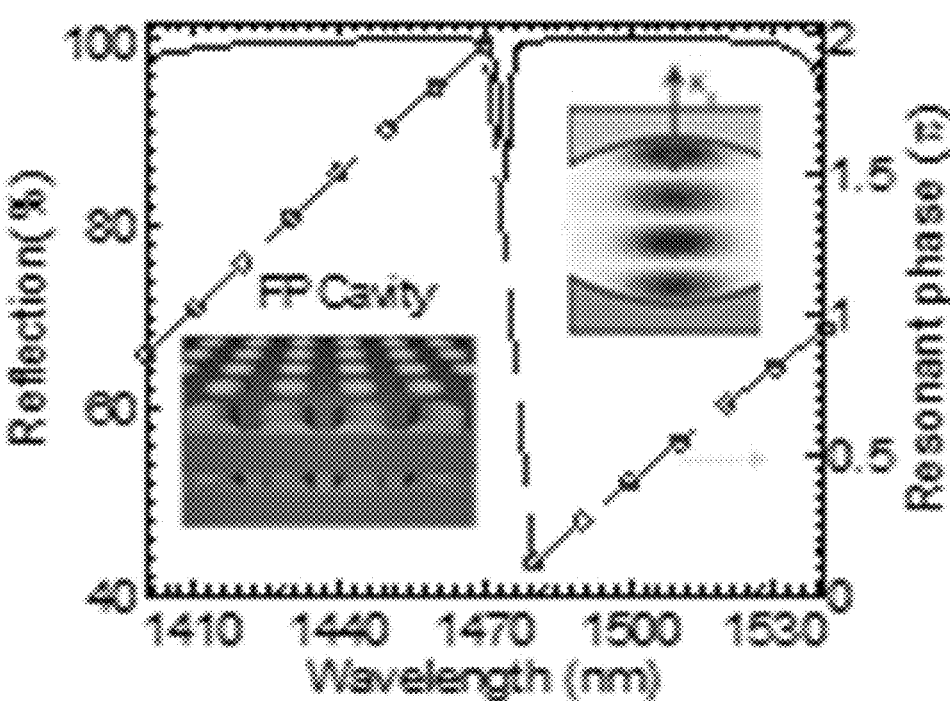
FIGS. 5A and 5B illustrates Fabry-Perot cavities based on two single layer photonic crystal slab membrane reflectors, according to one embodiment described herein.
Figure 5B:
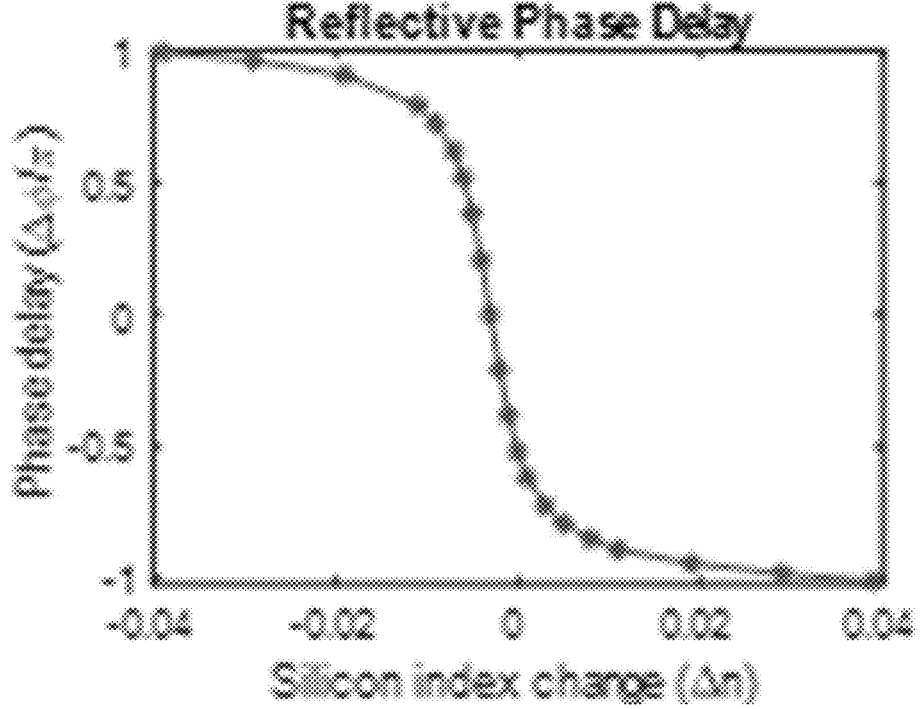

Structure 3: Fabry-Perot PCS cavity: In some embodiments, the present disclosure introduces the heterostructure design concept and considers incorporating electro-optical materials in the structure to achieve the desired $2\pi$ phase tuning range. Some embodiments can also consider PCS based FP cavity design for phase tuning. silicon. As shown in FIGS. 5A and 5B, an abrupt phase change (2) occurs at resonance location, due to the total phase changes occurred at top and bottom MR layers, as well as the phase delay associated with the effective FP cavity length. By control the refractive index of the bottom Si-MR, full $2\pi$ phase change at operating wavelength can be obtained over a small index change (~0.06). Additionally, electro-optical material (e.g. LNOI) can also be embedded inside FP cavity between two MRs for the desired high speed phase tuning, where pixel size can be smaller.

Figure 6:
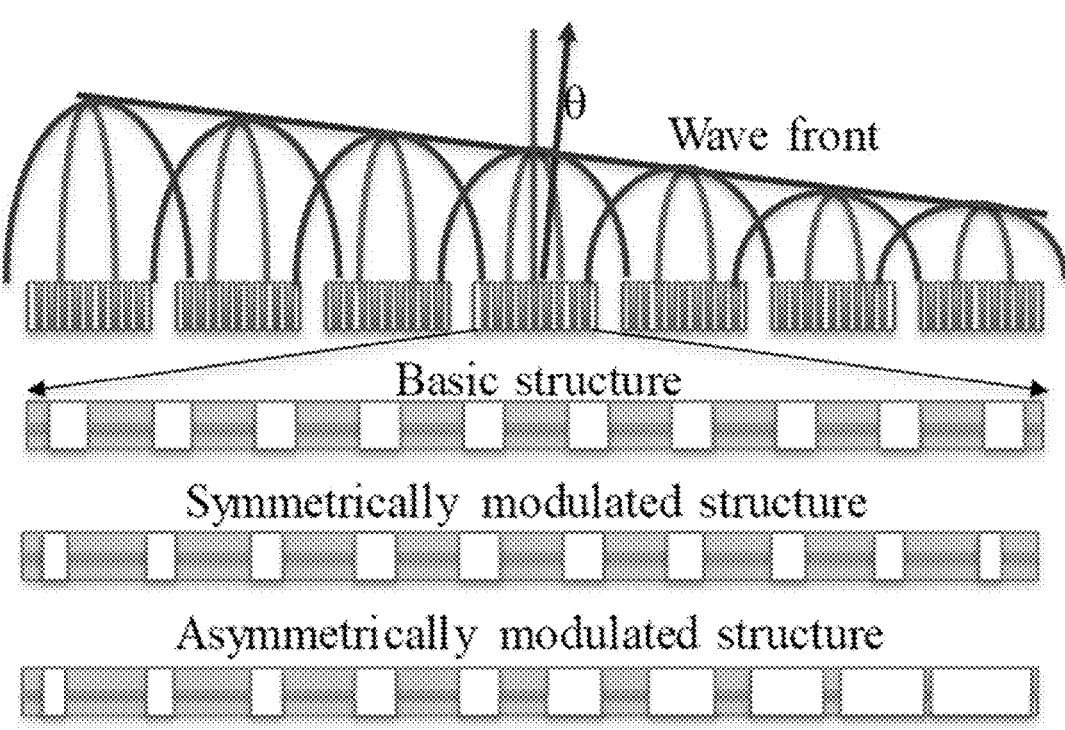
FIG. 6 illustrates a wavefront engineering and chromatic dispersion control, according to one embodiment described herein.

Structure 4: Investigation of gradient PCS designs to minimize chromatic aberration: Another useful issue to address is the chromatic aberration associated with phase discontinuities from pixel to pixel. The bandwidth of operation is a critical parameter in many types of optical devices. Chromatic dispersion is a problem in many optical devices, such as traditional diffractive optics. While many approaches have been explored to minimize chromatic dispersion for more extensive bandwidth operations, it is of great challenge to reduce chromatic dispersion in resonance based nanophotonic structures, including metasurfaces and bi-layer coupled PCS structures proposed here. As illustrated in FIG. 6, different phase modulation bandwidths for each pixel element (bi-layer PCS) can be achieved by exploring different types of lattice structures. While the basic lattice structure with uniform air hole can result in a relatively narrow spectral bandwidth, modulation of air hole sizes with either symmetric or asymmetric profiles may result in different spectral bandwidths, and thus possible chromatic dispersion control.

Beam steering in OPAs is achieved by imposing a phase gradient along a certain direction in the array. Extraneous beams, e.g., produced by grating lobes, need to be minimized in LIDAR applications as they can produce false positives during the scanning process. If the pitch a of a matrix of pixels (i.e., the spacing between emitters) is too large, it can cause grating lobes of similar amplitude as the main lobe. To avoid these grating lobes for any steering angle, the pitch should satisfy $a<\lambda/2$, where $\lambda$ is the wavelength in the material in which the array is immersed. This requirement trades off with the necessity of having a large enough pitch so that pixels do not interact with each other (no near-field coupling), and each can be controlled independently. Furthermore, if the phase of the field emitted by the pixel does not cover a $2\pi$ range, or its amplitude is not uniform across the phase range, the phase gradient will contain imperfections. These imperfections can be periodic with a period much greater than the pitch, thus producing lobes obeying a diffraction grating-type equation. We will investigate in more details during year 2 and 3 periods.

Figure 7:
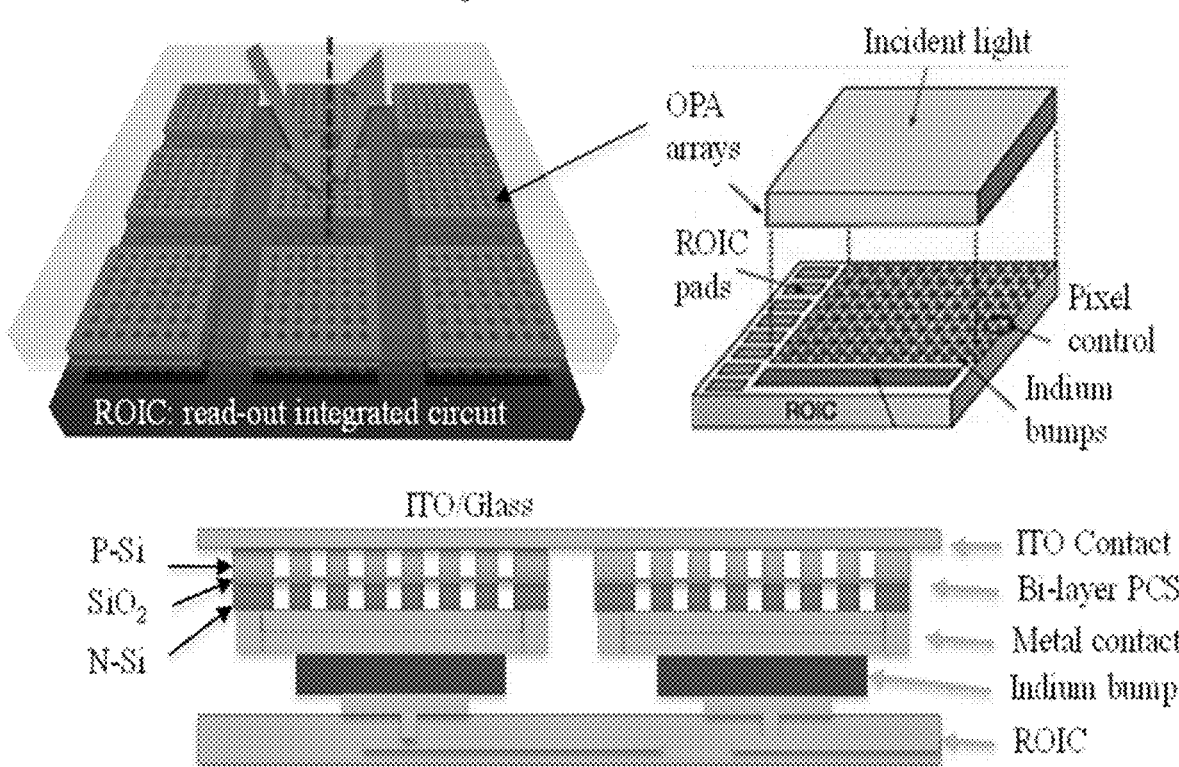
FIG. 7 illustrates an exemplary optical phased array with read-out integrated circuit control, according to one embodiment described herein.

Structure 5: Investigation of reflective phase tuning structures: In addition to the transmissive OPA designs, reflective OPA designs have been explored as well. There are apparent trade-offs for these two types of designs. Transmissive OPAs can be directly integrated onto a laser source, with simplified packaging requirements. However, the challenges may lie in the architecture of the large OPA control access (electrical access). On the other hand, reflective OPAs will be separated assembled and a system integration packaging scheme will be needed for beam routing and optical alignment. However, reflective OPAs have advantages in simplified electrical control schemes, as shown in FIG. 7. The reflective OPA array is controlled by the front transparent common indium tin oxide (ITO)/glass electrode and individually addressable read-out integrated circuits (ROIC) on the back via indium bump hybridization. This architecture is similar to the commercial focal plane array (FPA) imagers, and SLMs based on liquid crystals or deformable mirrors, where hybridization of amplitude/phase modulation elements is realized with back-side control ROIC electronics. By controlling the carrier concentrations in p-Si/n-Si layers via top ITO contact and bottom ROIC control, the optical resonance for each PCS changes rapidly, which results in reflection modulation at design/operation wavelength. Individual pixel sizes from 50 mm down to 10 mm will be designed for high speed and high fill factor SLM arrays. Some other technical challenges will also be addressed to achieve full $2\pi$ phase tuning and peak reflection greater than 90%, which can represent total reflection for the purpose of the present disclosure.

Figure 8A:
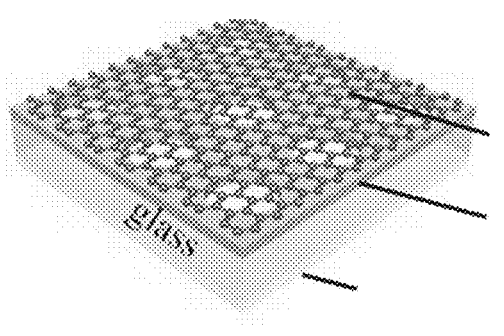
FIGS. 8A-8C illustrate different views of photonic crystal structures (PCS) and a simulation result, according to one embodiment described herein.
Figure 8B:
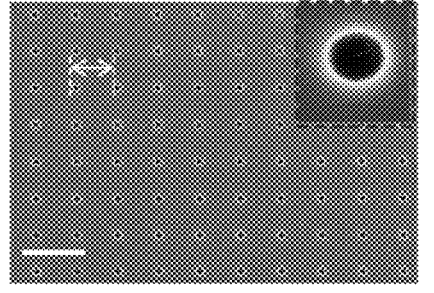
Figure 8C:
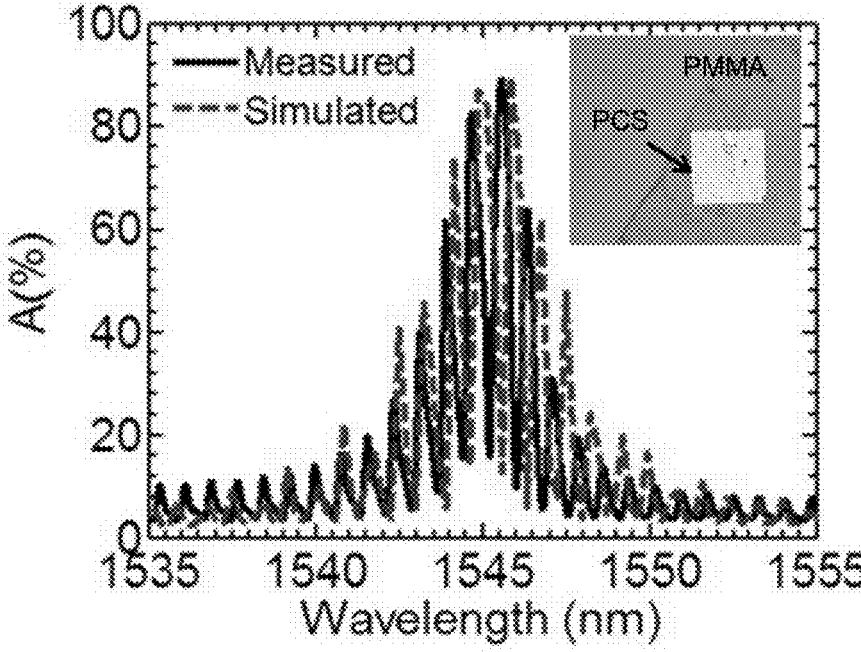

With regard to FIGS. 8A-8C, shown are views of photonic crystal structures (PCS) and a simulation result. FIG. 8A is a third dimensional schematic view of a perfect optical absorber by the critical coupling of the graphene to the PCS filter modes. FIG. 8B is a top view of the SEM images of a silicon-based PCS filter design. FIG. 8C is a simulated and measured absorption spectra. The PCS lattice constant a=770 nm, air hole radius is r=70 nm, slab thickness is h=249 nm. The insert shows microscopic image of the transferred PCS-graphene enhanced absorption device.

Next, Light Detection and Ranging (LiDAR) systems use laser energy in radar fashion to observe its surrounding environments as a function of range and examine both natural and manmade environments with accuracy, precision, and flexibility. An actively modifiable object surface (reconfigurable intelligent surface, RIS) enables the ability to change the reflected scattering for sensing and communication with the LiDAR sources over the free space. Similar technologies include the vehicle-to-vehicle (V2V) communications and asymmetric free space optical communications. While such structures can drastically enhance attributable platform sensing capabilities, it is still a technical challenge to achieve high speed while meeting c-SWaP (cost-size weight and power) requirements for practical deployment.

Thanks to the abundant existence of the guided-resonance modes, the photonic crystal slab (PCS) offers an opportunity for more efficient light-matter interaction. A 2-dimensional (2D) PCS consists of periodic lattices of air holes on a dielectric layer. Different optical properties and applications can be acquired by designing the lattice constant (a), air hole radius (r), and the thickness (t) of the PCS. By utilizing the coupling of PCS resonant modes and the graphene layer, prefect absorbers in the visible to infrared wavelength have been demonstrated theoretically and experimentally. As shown in FIG. 8A, the structure consists of a monolayer graphene transferred onto a silicon PCS on a glass substrate. Perfect absorption can be achievable by introducing a reflector on the back side of the glass substrate. The PCS layer consists of 2D square lattices of circular air holes, initially patterned on the Silicon-On-Insulator (SOI) wafer, as shown in FIG. 8B. In one non-limiting example, the lattice constant is 770 nm, air hole radius 70 nm, and the slab thickness is 249 nm. A back metal reflector was added to achieve close to 100% absorption under critical coupling conditions. The measured absorptance of laser beam with incident angle k 0 is over 85% (FIG. 8C). The latter research discovers the degenerate critical coupling and reveals that perfect absorption can be realized in a mirror-symmetric two-port PCS resonance configuration where the bottom reflector is not necessary for absorption enhanced by PCS structures.

Another opportunity for studying the perfect absorption with the PCS platform is that the fast switching of absorption/reflection can be implemented to achieve FORIS by utilizing the electro-optical and plasma dispersion properties of semiconductors in Si, Ge, GaAs, InP, etc.

There are reports of tunable reflectors and absorbers with different mechanism, including the thermo-optical effects, electronic circuit logics, conductivity-induced absorption modulation, and the anisotropy and birefringence (liquid crystal). A performance comparison is shown in FIG. 9, titled Comparison of different absorption switching technology.

Thermal effects on the medium of the resonators can drive the material index change or trigger the metal/semiconductor phase transition. The dynamic adjustment of the absorption by the external temperature control is demonstrated on the $VO_2$ microrings. However, temperature control is an indirect and slow process to modulate the light-matter interaction, and it becomes more complicated for the applications in thermal sensors. By utilizing the switchable birefringence of refractive index of liquid crystal in the ordinary and extraordinary rays in the presence of an electric field, an electronically tunable absorber in the THz regime can be realized. The absorption/reflection modulation can also be achieved by tuning the chemical potential of the graphene to match the impedance of incident wave, or by tuning the absorption rate of graphene-boron nitride to photonic crystal defect cavity mode.

However, near-perfect reflection modulation has not been realized by the coupling between defect modes and graphene absorption. Perfect reflection/absorption switching can be useful for embodiments of fast optical reconfigurable intelligent surfaces (FORIS) with low insertion loss (R=100%) and high extinction ratio (ER>20 dB with A=100%).

Based on charge-induced index change properties, high speed spatial light modulators (SLM) have been described above. The SLM structure consists of coupled two-layer PCS separated by a thin layer $SiO_2$ spacer.

As shown schematically in FIG. 8A and FIG. 8C, the electrodes were placed in contact with the PCS layers to inject charge and modulate the refractive index of the slabs. FIG. 8B shows a fabricated array of SLM pixels. The PCS surface size for the light beam modulation is 80 $\mu$m×80 $\mu$m, as shown in the SEM images in FIG. 1D. The zoomed in image of the PCS structure, shown in FIG. 1E, has a square lattice of circular air hole through the Si layer. The speed response was characterized in FIG. 1F, indicating that the 3 dB operation bandwidth can reach 200 MHz for the 80 $\mu$m square mesa. The bandwidth can be improved to above 1 GHz level with smaller PCS sizes and optimized heterostructure design and doping control. It's been reported that 3 dB cutoff frequency of 1.2 GHz is observed experimentally with 100 $\mu$m² device area[23]. Therefore, the PCS structures offer promising opportunities for achieving high-speed, low-cost, compact, and integrable FORIS system.

2. Fast Optical Reconfigurable Intelligent Surface (FORIS) Embodiments

Figures 10A, 10B:
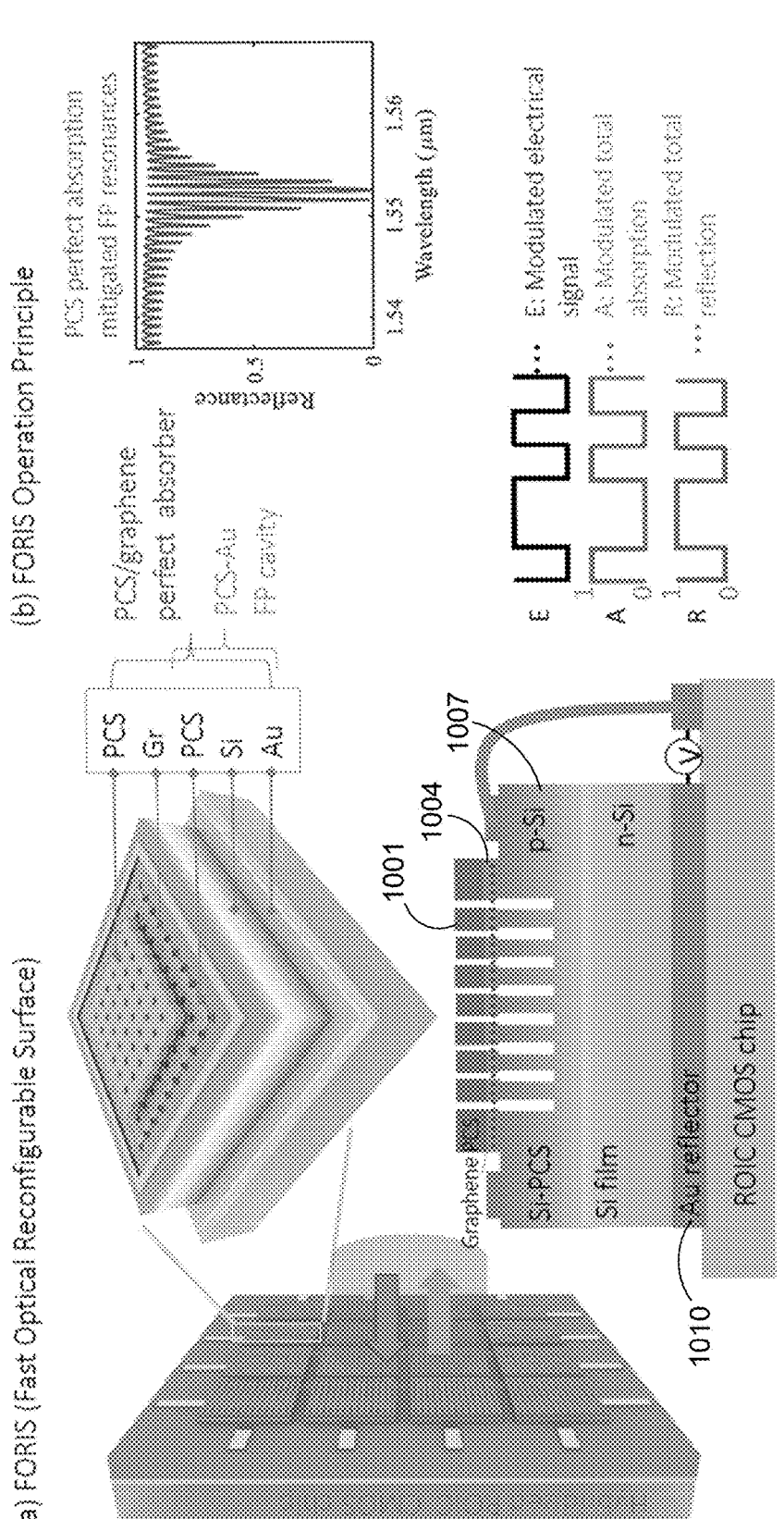
FIGS. 10A and 10B illustrate example schematics of a fast optical reconfigurable surface, according to one embodiment described herein.

With regard to FIGS. 10A and 10B, shown are different views of an example of an optical reconfigurable intelligent surface system. FIG. 10A shows a schematic view of the optical reconfigurable intelligent surface with detailed single pixel 3D and cross-sectional views. In some embodiments, the FORIS system can be fulfilled by an array of pixel modulators and controlled by electrical signals through the ROIC control electronics. In one non-limiting example, the structure can include a monolayer graphene sandwiched in between a coupled bi-layer PCS cavity. A back metal (e.g., gold (Au)) reflector is also incorporated to achieve perfect absorption at resonance. In the FIG. 10A, the gold reflector is coupled to a bottom electrode. The bottom electrode is coupled to a top electrode. Accordingly, FIG. 10A illustrates a two electrode design implementation. In other embodiments, a via (e.g., electrical connection can be inserted into the material layers in order to connect the top electrode (e.g., metal ring) to the gold reflector. In some embodiments, the top electrode surrounds the graphene layer (e.g., the metal ring) and is positioned on the silicon PCS layer. Accordingly, the optical switching device of FIG. 10A includes a first PCS layer 1001, a graphene layer 1004, a second PCS layer 1007, and a metal reflector 1010. The first PCS layer 1001, the graphene layer 1004, and the second PCS layer 1007 can have multiple apertures spaced throughout each layer.

FIG. 10A also illustrates a PCS-AU FP cavity. This cavity is formed by the second PCS layer 1007 and the metal reflector 1010. The FP cavity is for fast modulation of PCS mode, while the top PCS/Graphene cavity forms a high Q filtering mode to reach the critical coupling condition. Both cavities work together in this design.

FIG. 10B illustrates an operation principle for some of the FORIS embodiments. With the control of Si index, PCS resonance and/or FP resonance can be controlled/modulated, which results in modulated total absorption (A) and total reflection (R). Accordingly, the electrical modulated signal changes the Si refractive index, which causes a spectral resonance shift and thus switching between total absorption and total reflection of a light directed at a surface of the apparatus, due to the detuning from the critical coupling condition. Notice here the embodiments are directed to control PCS absorption mitigated FP resonances for ultra-low power modulation, as shown in the simulated spectrum on the top.

Figures 18A, 18B:
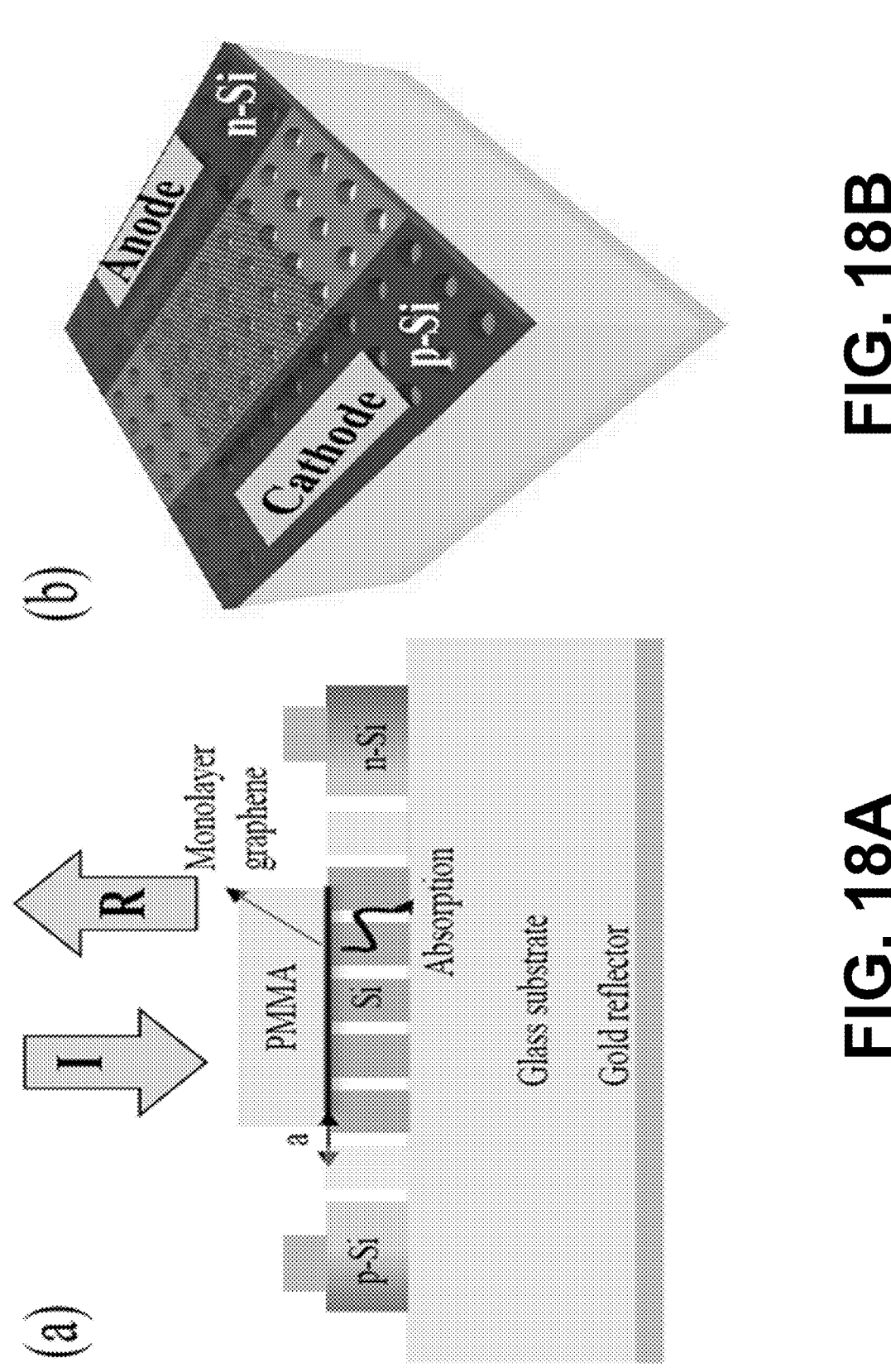
FIGS. 18A and 18B illustrate views of an electrical charge injection for a single-layer PCS-graphene absorption system, according to one embodiment described herein.

The FORIS embodiments of the present disclosure can include an array of reconfigurable units (or pixels) whose optical properties can be modulated through reflection, absorption, and transmission in present of incident laser beams, as shown in FIG. 10. FORIS embodiments can be integrable by the common readout integrated circuits (RO-ICs) through mature hybridization technology to realize the reconfigurability and modulation of its surface properties. FIG. 10A shows the schematic for the FORIS device. The zoomed-in sketches show the vertically stacked layers of one pixel in 3D and cross-sectional views. The structure can include a monolayer graphene (Gr) sandwiched in between a coupled bi-layer PCS cavity for critically coupled perfect absorption design. The bottom PCS layer is patterned on a partially etched Si layer, with a gold reflector deposited on the bottom side of this Si layer. Additionally, the bottom Si layer is also carefully designed to form a p-i-n doped structure to facilitate Si index modulation via plasma dispersion effect. The gold reflector supports the critical coupling with the PCS filter modes and serves as a common ground plate for electrical charge injection into different pixels. In other non-limiting examples, a reflector can be comprised of a metal than other gold, such as silver, copper, and other suitable metals. In other examples, instead of vertically stacked layers, a lateral arrangement can be implemented (e.g., see FIGS. 18A and 18B).

The operation principle for the FORIS system is shown in FIG. 10B. With applying an electrical modulation signal, the interrogating beam gets fully reflected or completely absorbed due to the modulation of the surface properties. The pixels can work individually to communicate with other terminals. The pixels on the FORIS embodiments can also work together to implement the spatial multiplexing and beamforming with the wireless multiple-input multiple-output (MIMO) protocol. The high-Q PCS filter, enhanced absorption by critical coupling, refractive index tuning, and reflection/absorption switching will be investigated and developed to implement the FOR IS.

Also shown in the top panel of FIG. 10B is the simulated reflection spectrum with fast oscillation between R=100% and R=0% due to perfect absorption mitigated F-P resonance control. It is worth noting here the coupling between top bi-layer PCS cavity resonance and the bottom PCS-Au F-P cavity resonance can be individually optimized to achieve the desired reflection spectral properties, with potentials towards operation wavelength tuning.

The embodiments of the proposed FORIS system can have one or more the following features:

Reconfigurable surface driven by the electro-optical modulation: the switching device adopts a stacked photonic crystal membrane capacitor-like structure, employing a doping configuration of n-Si/spacer/p-Si. Electrical coupling can be enabled by the plasma dispersion effect, in which the concentration of the free carriers in silicon changes the real and imaginary parts of the refractive index. The switching of reflection/absorption happens due to the PCS resonance shift.

Low cost and high sensitivity: the switching device is fabricated on the common SOI platform with easy process of transfer printing technology. The PCS filter originates from the high-Q guided-resonance mode and possesses high sensitivity. On the other hand, the silicon index change for a complete switchover can be designed by the PCS lattice configuration and the vertical structure.

Operation in the infrared regime and beyond: the initial goal is to verify the switching performance on the SOI platform at the 1,550 nm. Wavelength scaling is possible by the silicon PCS in the near and short infrared region (e.g., 940 nm to 2.1 μm). Other materials can be used for different wavelengths based on compound semiconductor on oxide material platform also (CSOI, e.g. GaAs, InP, GaN on silica, SiC). Thanks to the design freedom of the Q factor, degeneracy, and symmetry-breaking of the PCS guided-resonance modes, expanding the concept of reconfigurable surface to dual-wavelength or multi-wavelength operation is feasible.

High response speed and broader modulation bandwidth: the switching device enjoys the high-speed of switching with broad modulation bandwidth at GHz level, much faster than the thermo-optics- or liquid crystal-based tuning methods. The PCS structures, from the single-layer slab to coupled bi-layer slabs, offer a promising platform for compact and fast electro-optical modulation. In one non-limiting example, the electrical signal applied to a FORIS embodiment can be modulated in a range between 0 GHz to 10's GHz.

Flexible control schemes: In addition to the proposed electrical control scheme shown here, we can also add electrode on the top PCS layer to introduce three electrode control schemes, where PCS resonances, F-P resonances can be controlled separately and jointly. This can result in potentially both fast RIS (R/A modulation) at single resonance or multiple resonances. CMOS-compatible integration and compactness: The whole fabrication process is complementary metal-oxide-semiconductor (CMOS)-compatible for integration. The transfer printing process can be easily performed at the room temperature. The PCS guided-resonance mode (located above the airline at the Γ point) is confined in the thin layers of slabs and interact with the graphene layer through the radiation channels. In this regard, the structure has great compactness.

Reliable structure and scalable platform: The proposed fast switching device is based on solid-state materials, i.e., Si, SiO$_2$, metals, etc. No phase transition, liquid states, or moving parts is required and it is non-mechanical and thus more reliable under harsh environments for high attitude attritable platforms. The guided-resonance modes exist due to the dielectric permittivity modulation and the PCS is scalable in both size and material. Although the wavelength for the critical coupling condition could be impacted in different size of PCS, the perfect absorption concept is still the same.

Complete switching of surface properties in amplitude and phase: the device can exhibit perfect absorption or reflection at target wavelength. The applied voltage on the modulator can trigger the spectral shift and thus the switching. Additionally, the phase tuning is also possible, based on our work on full $2\pi$ phase control in PCS layer.

3. Related Research and Preliminary Design and Performance Estimate

Figures 11A, 11B, 11C:
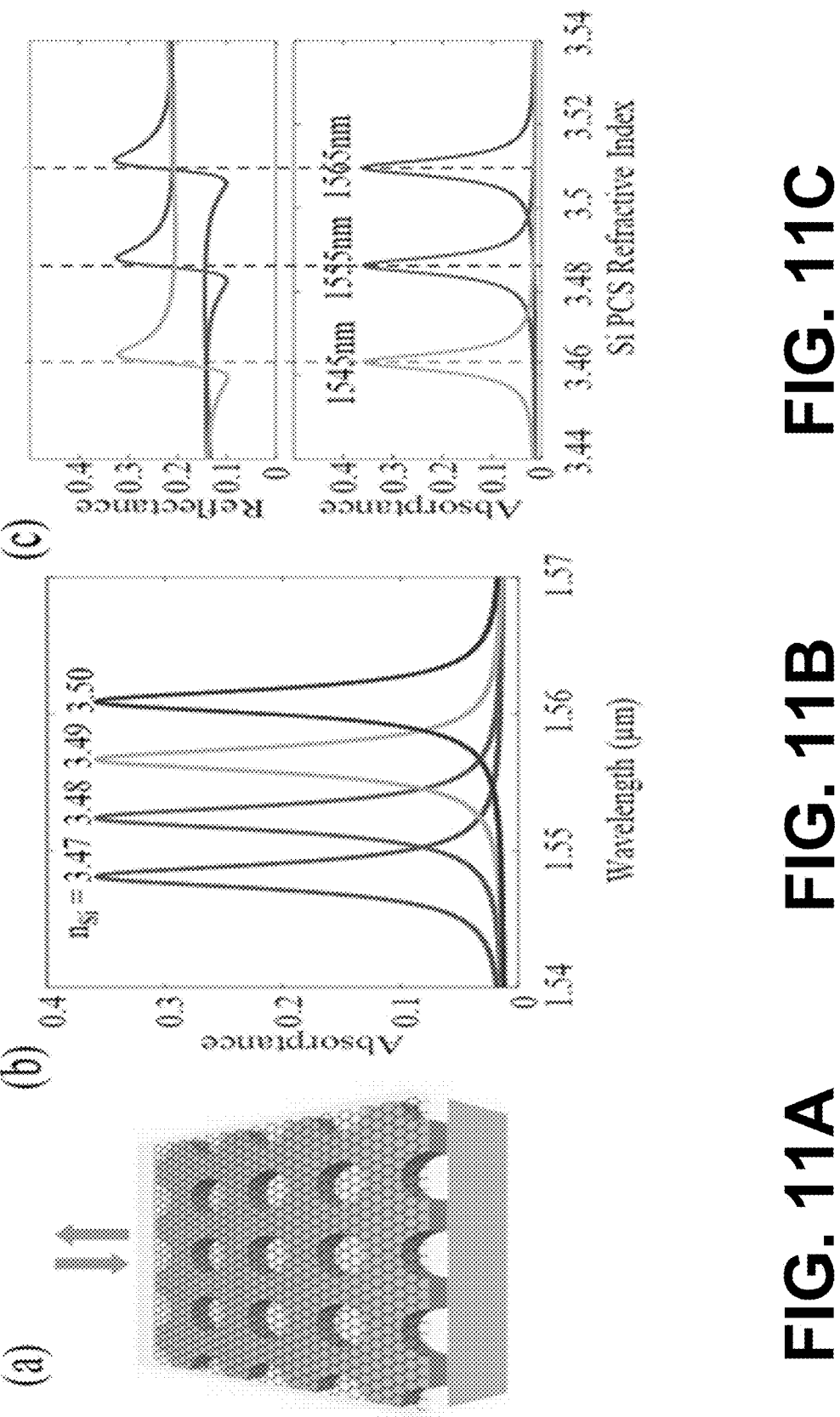
FIGS. 11A-11C illustrate a model of a PCS-graphene absorber structure and graphs related to the model, according to one embodiment described herein.

FIGS. 11A-11C show the tunability of laser beam absorption by introducing the refractive index change to the Si—PCS layer. FIG. 11A represents a toy model of the PCS-graphene absorber structure. The PCS includes square lattice of circular air holes sitting on top of a glass substrate. The graphene monolayer is attached to the top of the Si—PCS under a layer of PMMA which can be removed optionally. FIG. 11B includes a graph of the absorptance spectral shift under different Si refractive index. FIG. 11C includes graphs of an absorption/reflection as a function of Si—PCS refractive index at three different wavelengths (i.e., 1545 nm, 1555 nm, and 1565 nm).

The PCS in FIG. 11A has a square lattice of circular air holes with lattice constant a=770 nm, hole radius r=70 nm, and slab thickness h=250 nm. The PCS nanomembrane is placed on top of a glass substrate fulfilled by the transfer printing techniques. A single layer of graphene is attached on the top of the PCS with the help of a thin layer of poly-methyl methacrylate (PMMA) which is assumed to be 180 nm thickness for the simulations. Due to the 90-degree rotational symmetry of the square lattice, the structure is polarization-independent to surface-normal incidence. The reflectance (R) and transmittance (T) under Ex- (or Ey-) polarized incidence can be simulated by unit-cell simulations with periodic boundary conditions. FIG. 11B and FIG. 11C show the simulation results using the Stanford S4 package. Under a single wavelength excitation, the absorptance (A) of the PCS-graphene structure can be derived by the relation A=1−R−T and the absorptance spectra under different Si index are obtained in FIG. 11B. The Si index change clearly induces the spectral shift, with 0.01 index change corresponding to 5 nm spectral shift. At a certain wavelength, the Si index change will result in the modulation of absorption, as shown in FIG. 11C. The reflectance shows a typical Fano lineshape, while the absorptance has peak value of ~35% at the resonance condition (a combination of wavelength and Si refractive index). Therefore, with a single-frequency excitation, the absorption can be switched between the maximum and near-zero value by introducing the refractive index changes. The design method can be easily adapted to more complicated cases, such as the coupled bi-layer PCS structure.

Figures 12A, 12B, 12C:
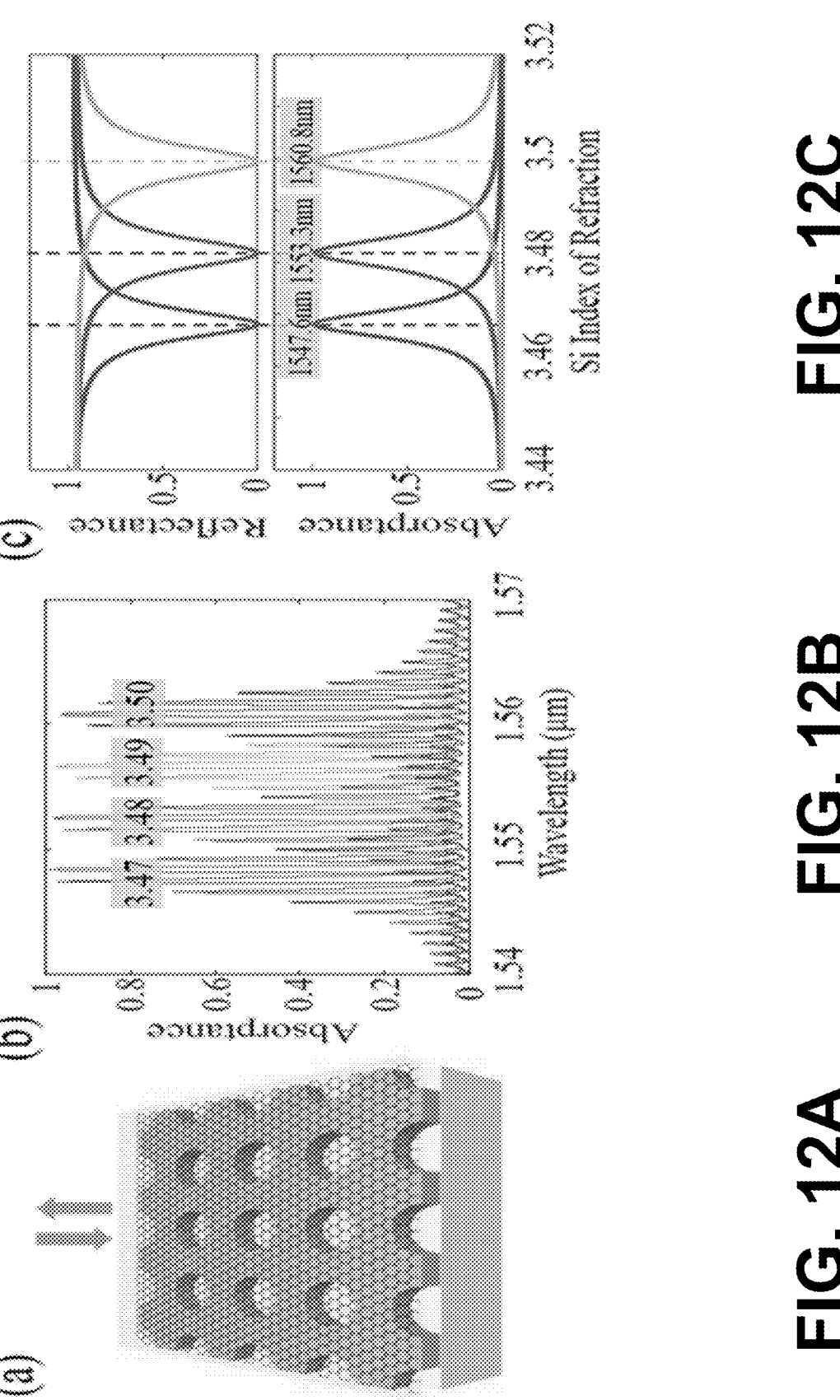
FIGS. 12A-12C illustrate a schematic of single-layer PCS graphene absorption switching device and graphs related to the switching device, according to one embodiment described herein.

The Si—PCS layer has a square lattice of circular air holes, patterned with lattice constant a=770 nm and air hole radius r=70 nm. The slab thickness is 249 nm. The PCS layer is placed on top of a 1 mm glass slide with its backside deposited a near-perfect layer of gold mirror. The graphene is transferred directly to the top of the PCS layer together with a 180 nm PMMA polymer layer. The simulated spectra of surface-normal incidence are shown in FIG. 12(b) with different assumed Si index (3.47, 3.48, 3.49, and 3.50, respectively). The silicon index change results in a shift of the absorption spectrum, with 0.01 index change corresponding to ~4.1 nm spectral shift (i.e., 0.41 μm per refractive index unit). Such spectral shift by changing the refractive index can be converted to the index-depended reflection or absorption modulation. FIG. 12C shows the reflection/absorption switching implemented by the Si index change, at three single wavelengths, i.e., 1,547.6 nm, 1,553.3 nm, and 1,560.8 nm, respectively. Due to the back reflector, the transmission (T) of the two-port system is 0, and the incoming electromagnetic waves will either be absorbed by graphene or reflected by the mirror/filter structure. When the incident wavelength is 1,553.3 nm, shown in FIG. 12(c), the absorption reaches its peak value of over 99.3% at Si index of 3.482 and the reflection is minimized to less than 0.62%. A complete switching between perfect reflection and absorption is possible when the Si refractive index change is larger than a threshold (e.g., 0.02). As can be seen from FIG. 12B, a faster oscillation is observed in the absorption spectrum which is a result of the FP resonance between the top PCS and the bottom gold mirror. The high-sensitive switching provides another opportunity through the 'external-cavity' modulation to further narrow down the index change requirement for a complete switching.

Figures 13A, 13B:
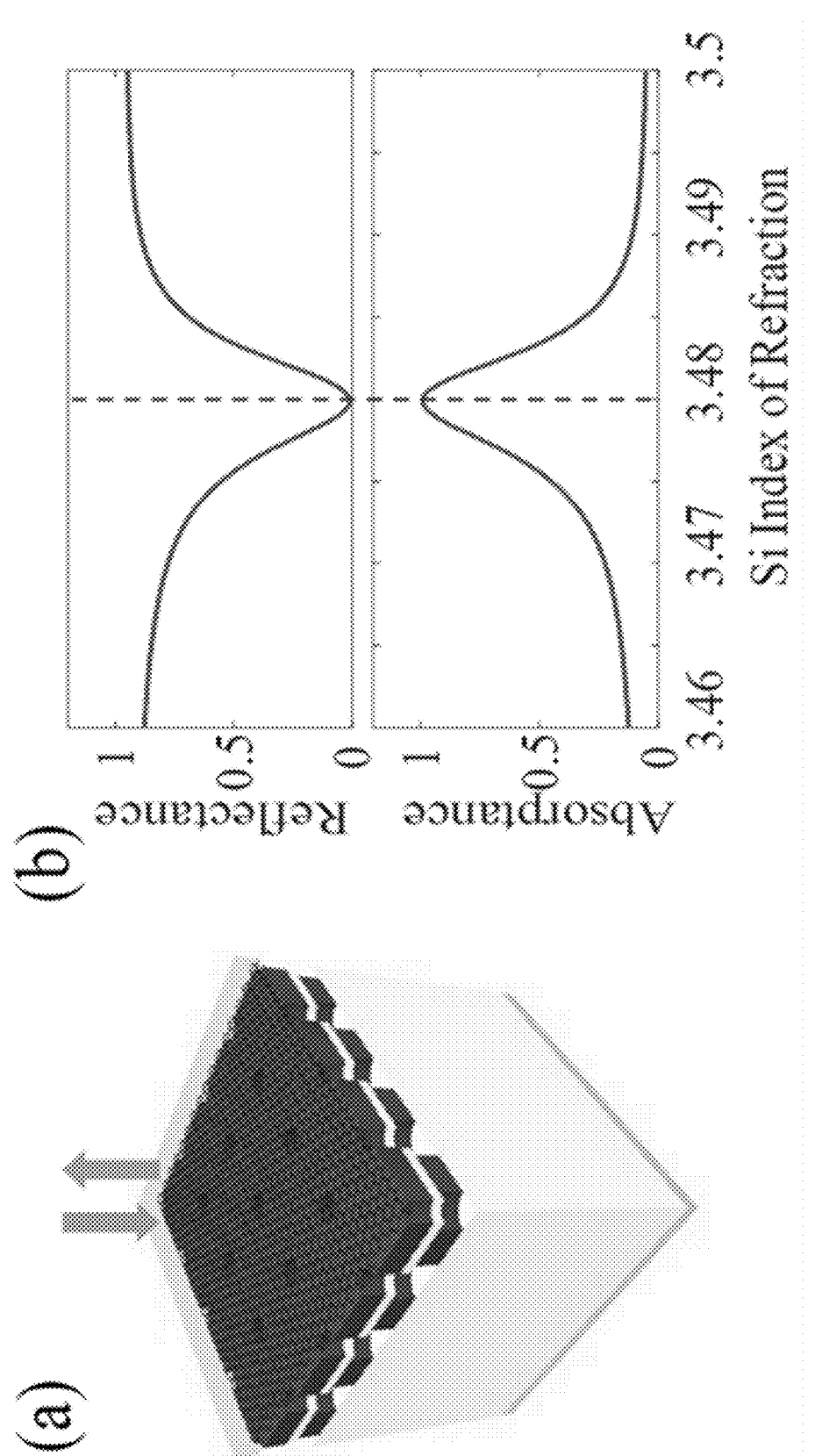
FIGS. 13A and 13B illustrate a schematic of double-layer PCS absorption structure and a graphs related to the double-layer PCS absorption structure, according to one embodiment described herein.

The proposed double-layer PCS-graphene structure is shown schematically in FIG. 13A, which consists of the double-layer PCSs separated by a thin layer of silicon dioxide, a glass substrate with backside deposited gold mirror, and the graphene with PMMA on the top. In the simulations, the top layer PCS has lattice constant 750 nm, air hole radius 60 nm, and slab thickness of 230 nm; the bottom layer PCS has lattice constant 750 nm, air hole radius 240 nm, and slab thickness of 230 nm; the middle SiO$_2$ layer has a thickness of 20 nm and the same lattice configuration as the top layer. The graphene monolayer has the same thickness and index dispersion as the simulations in FIGS. 11A-11C. The top layer PCS can function as a filter, while the bottom layer PCS functions as a low-Q reflector which is similar with the bottom gold reflector. The simulated reflectance and absorptance are shown in FIG. 13B. The incident excitation wavelength is 1,550.12 nm and the absorption reaches its peak value when the Si index is 3.48. The maximum absorption obtained in the simulation is 99%, and the minimum reflection is 1%. The refractive index change required for switching over a region that covers 10% reflection and 10% absorption is between 0.01 to 0.02.

Figures 14A, 14B, 14C:
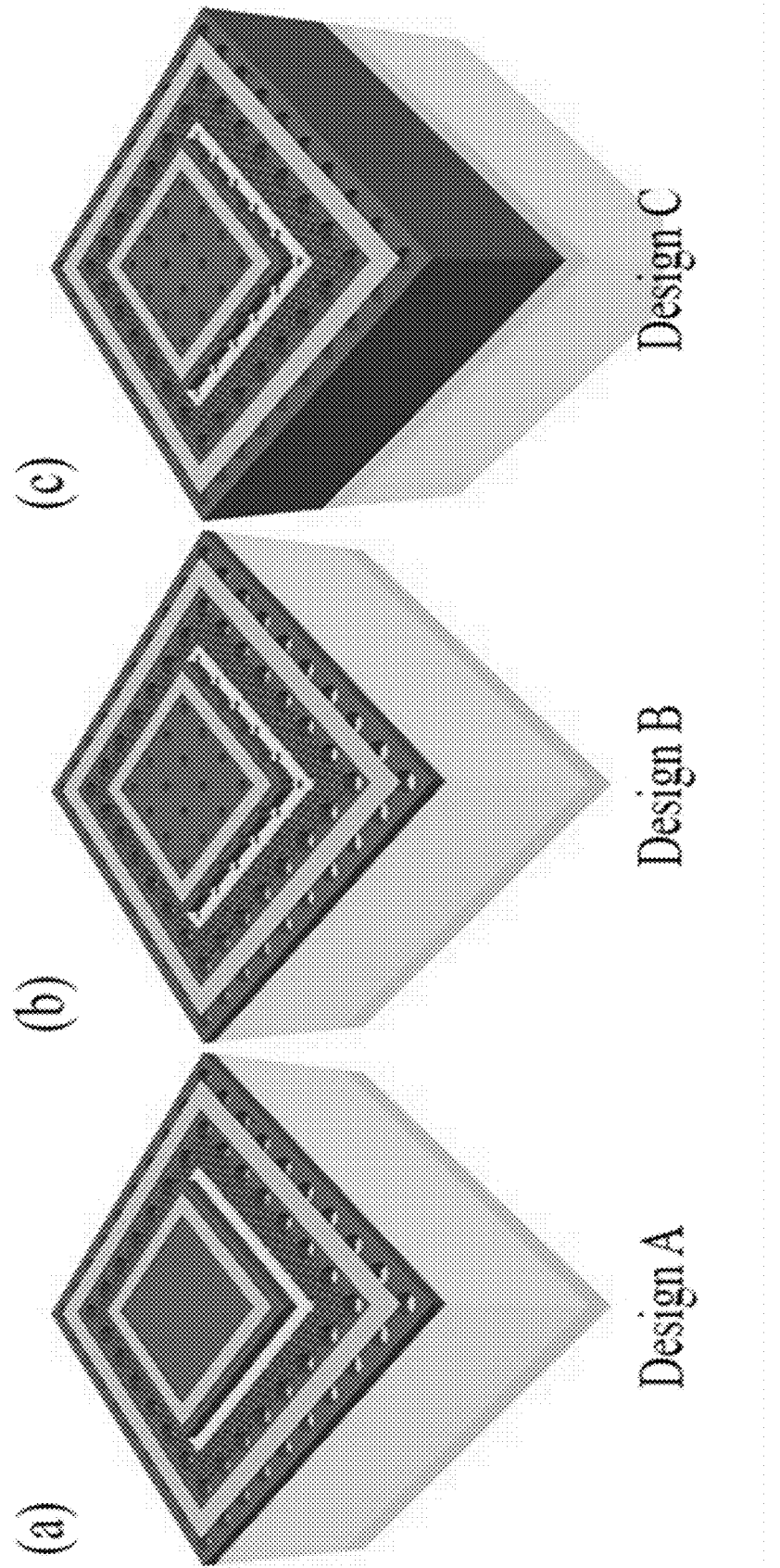
FIGS. 14A-14C illustrate example designs of the double-layer PCS-graphene absorption scheme, according to one embodiment described herein.

FIG. 14 shows three coupled bi-layer PCS designs for potential FORIS applications. The yellow rings are the circular electrodes for charge injection. The double-layer PCS structures in all three designs are feasible in fabrication with the help of transfer printing techniques. The graphene monolayer is placed in the middle of the bi-layer PCS structure with the thin SiO$_2$ layer. Design A has a single-layer PCS patterning at the bottom layer and an unpatterned Si slab on the top layer. The thickness for the top-layer Si is 230 nm, and 20 nm for the SiO$_2$ spacer layer. The photonic crystal (PhC) in the bottom layer has lattice constant 842 nm, and air hole radius 80 nm. The double-layer structure is transferred on a glass substrate whose backside is deposited with a layer of gold for back reflection. Both the two Si layers have PhC patterns in Design B. The top Si layer and the middle SiO$_2$ layer have PhC pattern with lattice constant 750 nm, and air hole radius 60 nm. The bottom PCS has lattice constant 750 nm and air hole radius 240 nm. Design C has the same PCSs lattice configuration with Design B but different substrate. The bottom PCS layer is a bulk Si with thickness of 10 μm and the air hole patterns are partially etched down 230 nm. The double-layer PCS structure is then placed on the top of a gold reflector and glass substrate.

Figures 15A, 15B:
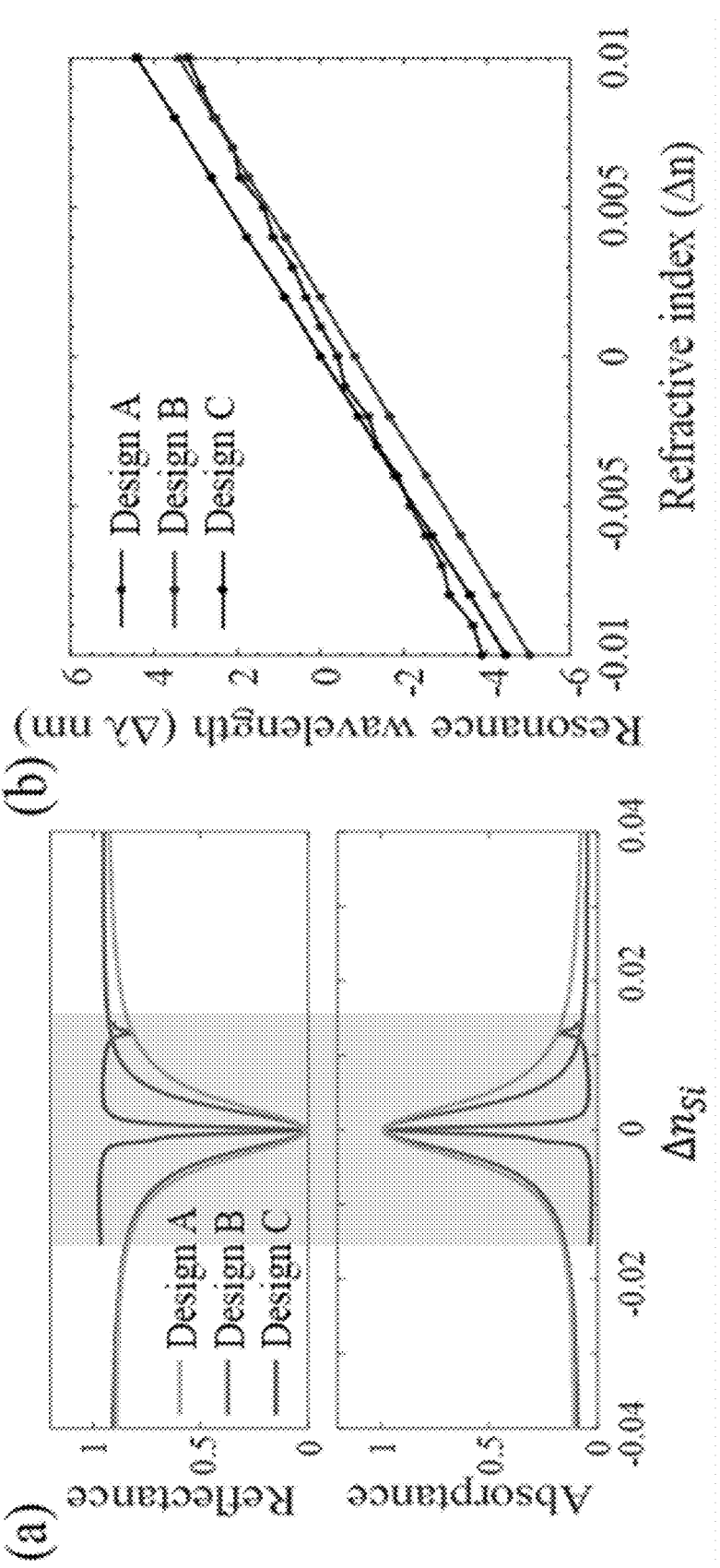
FIGS. 15A and 15B illustrate refractive index-depended surface properties and wavelength detuning of the double-layer PCS designs, according to one embodiment described herein.

The relations between the reflection/absorption of the three designs to the Si index change are depicted in FIG. 15(a), and the sensitivity of resonance frequency shift to the refractive index change is plotted by the Δλ-Δn relation in FIG. 15(b). The Design A has slower absorption change than the Design B in response to the Si index change. The asymmetric slope for design B is induced by the different lattice configurations of the top and bottom PCS layers. Design C has the maximum sensitivity and steepest response to the Si refractive index change. The minimum index change for a complete reflection/absorption switch-over (90% R, 90% A) is 0.01-0.02 for Design A, ~0.01 for Design B, and <0.003 for Design C. Because the modulation of refractive index in Design C happens outside of the PCS cavity, we define such phenomenon of enhanced sensitivity to index change the 'extracavity design'. On the other hand, we can apply the theory of coupled dark states in a lattice mismatching double-layer PCS system to explore the impact of higher Q factor on the index change requirements for complete switching. On the contrast of the extracavity design, the double-layer PCS structure and the coupled dark states are referred to as 'Intracavity design' in this proposal.

Figures 16A, 16B:
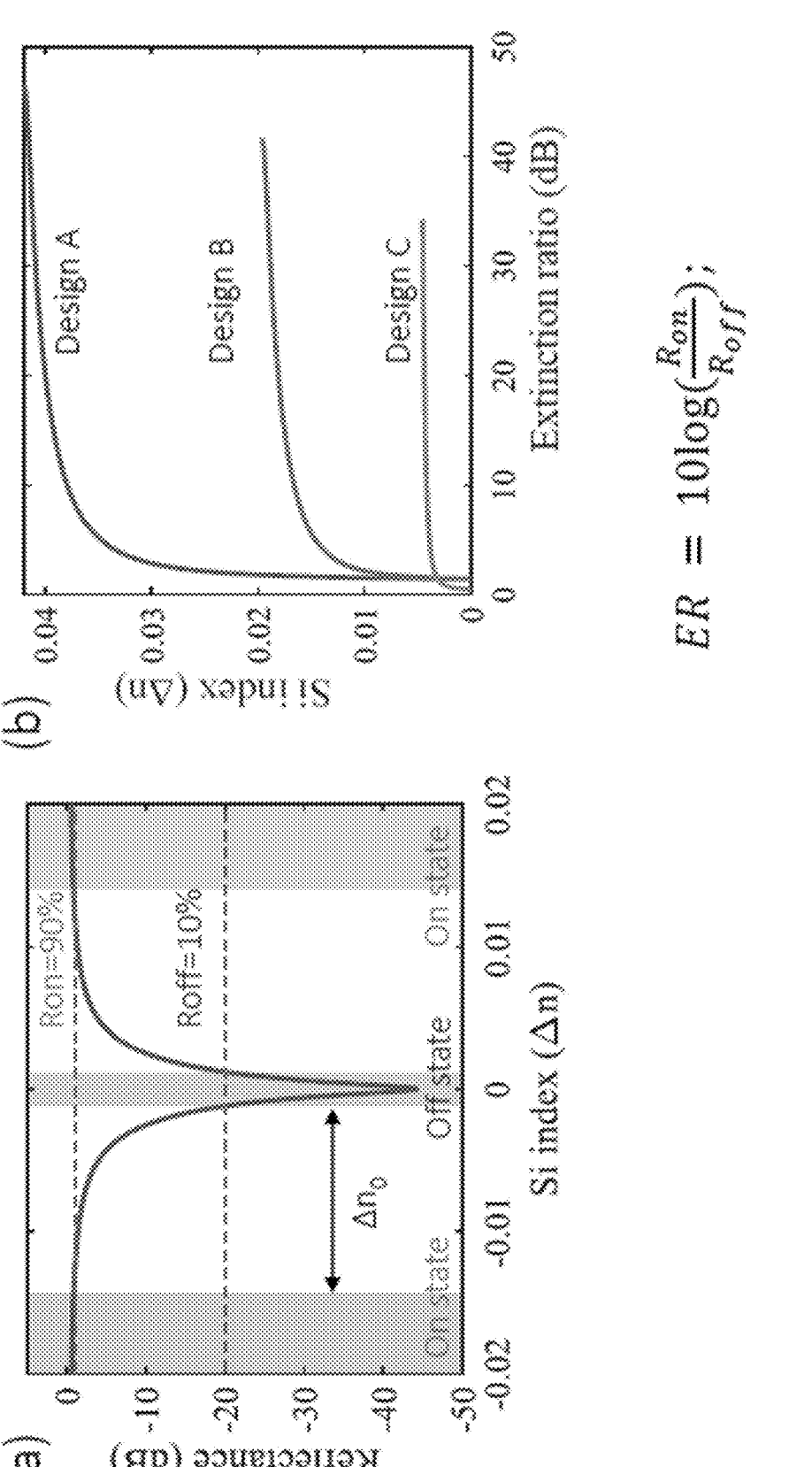
FIGS. 16A and 16B illustrate index-modulated state switching, according to one embodiment described herein.

A higher sensitivity in the R-Δn relation is also important for energy-saving operation, as shown in the figure of merit (FOM) pictures in FIG. 16. For practical communication application, the binary operation can be defined by the threshold values in reflectance. FIG. 16(a) shows the operation regions of on (red shaded) and off (blue shaded) states. Different threshold values can be used to calibrate these regions of operation. As an FOM of the index modulation, FIG. 16(b) shows the extinction ratios of the proposed three double-layer designs, which is defined in the log scale as the ratio of on-state threshold to the off-state threshold. Design C can realize higher extinction ratio with smaller index change. In this proposed semiconductor devices, the index modulation is linearly related to the applied bias voltage. Therefore, when operating at high speed, the Design C can be more energy-efficient with optimized electrical charge injection. By utilizing the proposed structures and intracavity and extra cavity designs, we are confident to finish the task of optimizing the required index change for complete switching.

Figures 17A, 17B:
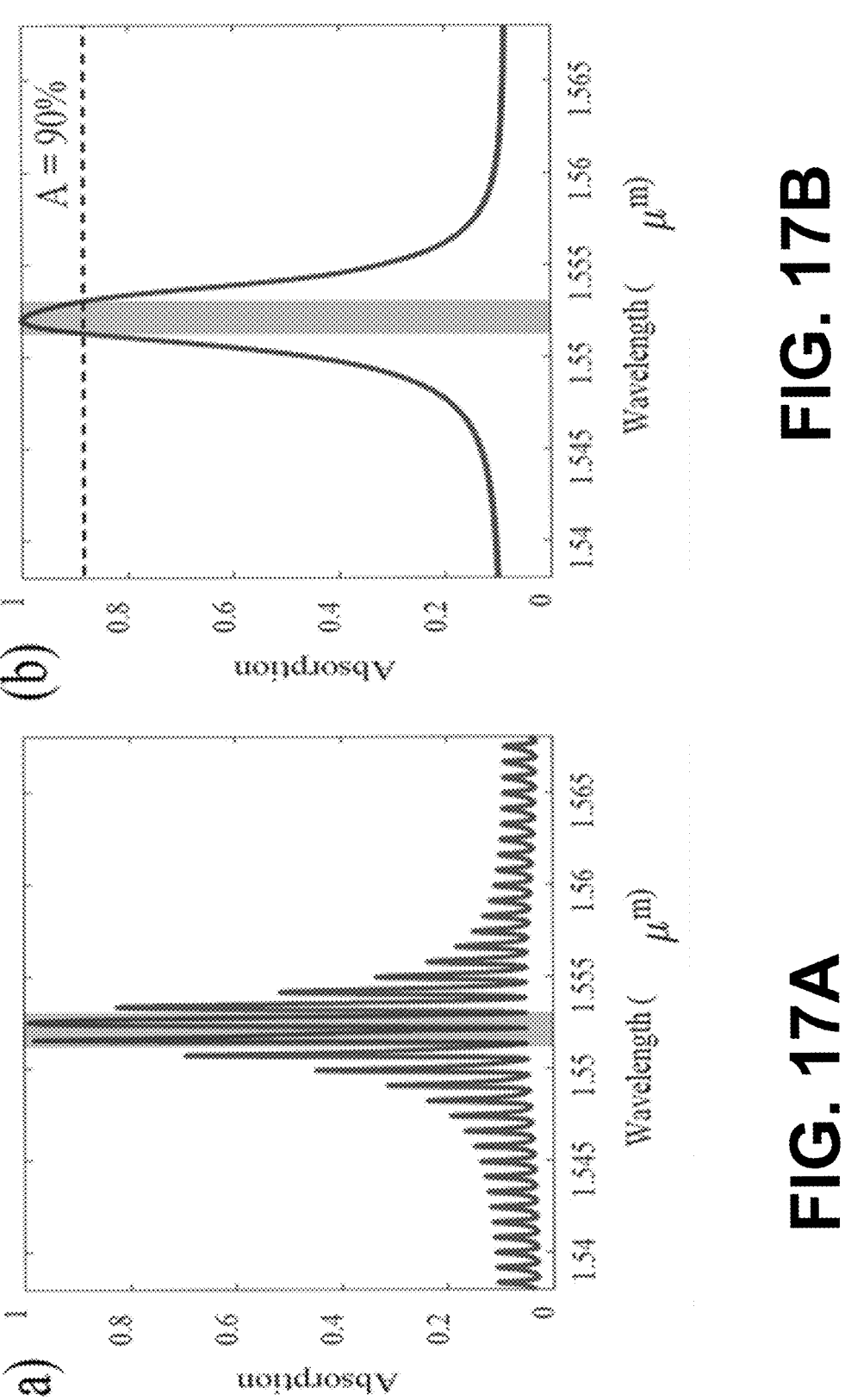
FIGS. 17A and 17B illustrate electro-optical modulation through different optical modes, according to one embodiment described herein.

FIG. 17 shows the simulated absorption spectrum with the structure proposed in FIG. 12. With the thickness of the glass substrate reduced to 500 nm, the absorption spectrum, shown in FIG. 17(b), reveals the slow-varying modulation envelope in FIG. 17(a). Within the spectral range selected by the PCS filter, the fast oscillation of the FP resonance can be utilized to implement the reflection modulation. Assuming an off state require above 90% absorption, the spectral range is 1.6 nm, which is marked by the shaded regions in FIG. 17. Within the 1.6 nm which covers 2 FP resonant peaks, it is practical to utilize such fast and strong modulations. This task will also investigate the efficiency of index modulation, including the intracavity (PCS design), extracavity (FP mode), and combined schemes for different application scenarios.

For electrical charge injection into a single-layer PCS device, the doping profile can be positioned in the PCS plane. The PCS region is undoped Si while the left and right boundaries are connected with p-Si and n-Si, respectively, as shown in FIG. 18. Such inplane carrier-induced refractive index modulation has been explored in external cavity frequency modulation applications.

Figures 19A, 19B:
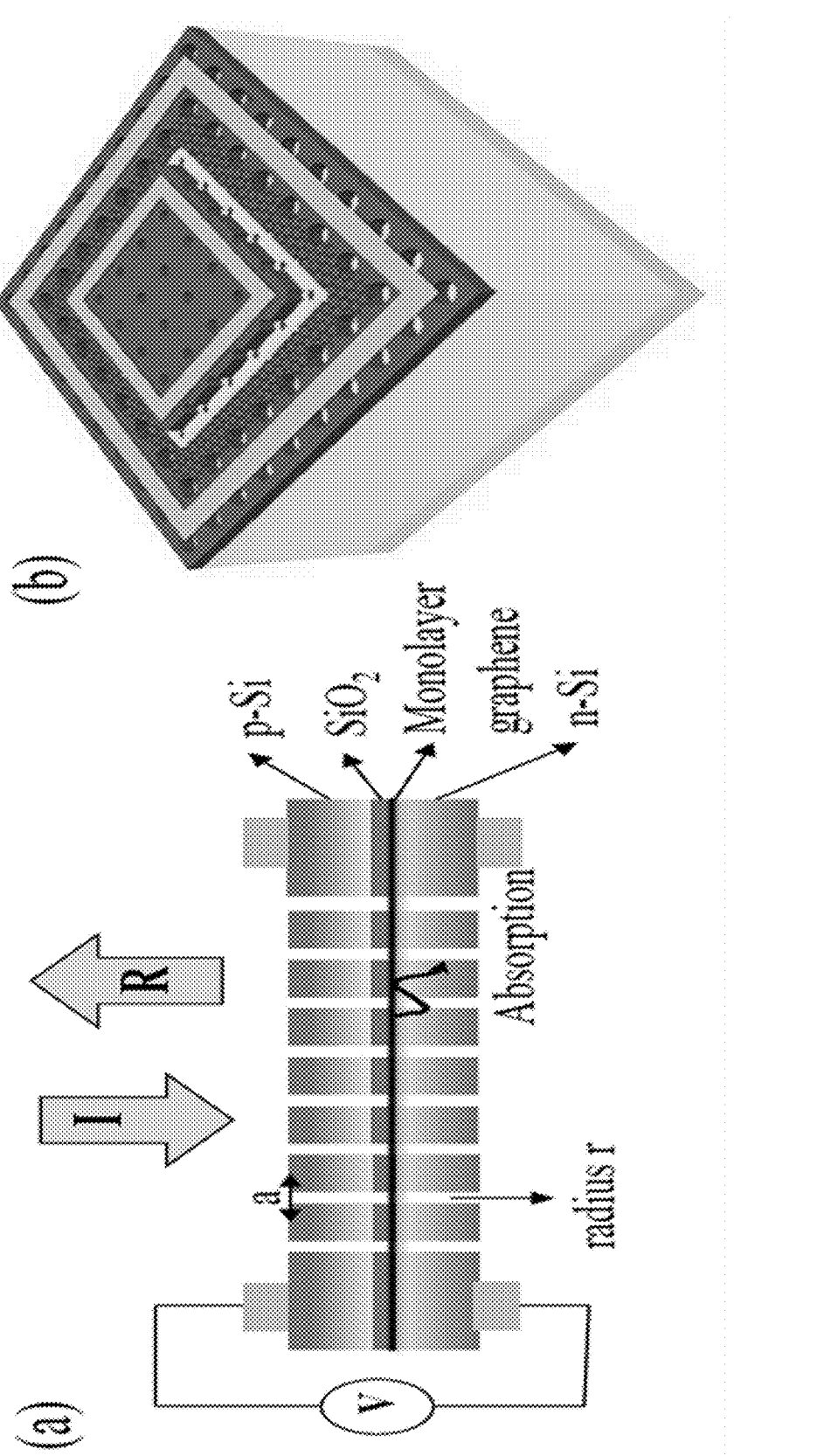
FIGS. 19A and 19B illustrate views of an electrical charge injection for a double-layer PCS-graphene absorption system, according to one embodiment described herein.

The carrier injection for the double-layer PCS device will be similar with our previous design, as shown in FIG. 19. The difference is that the absorption device has a graphene monolayer between the two PCS layers. Our previous work has shown the impact of SiO_2 spacer layer thickness on the optical and electrical performances.

Figure 20:
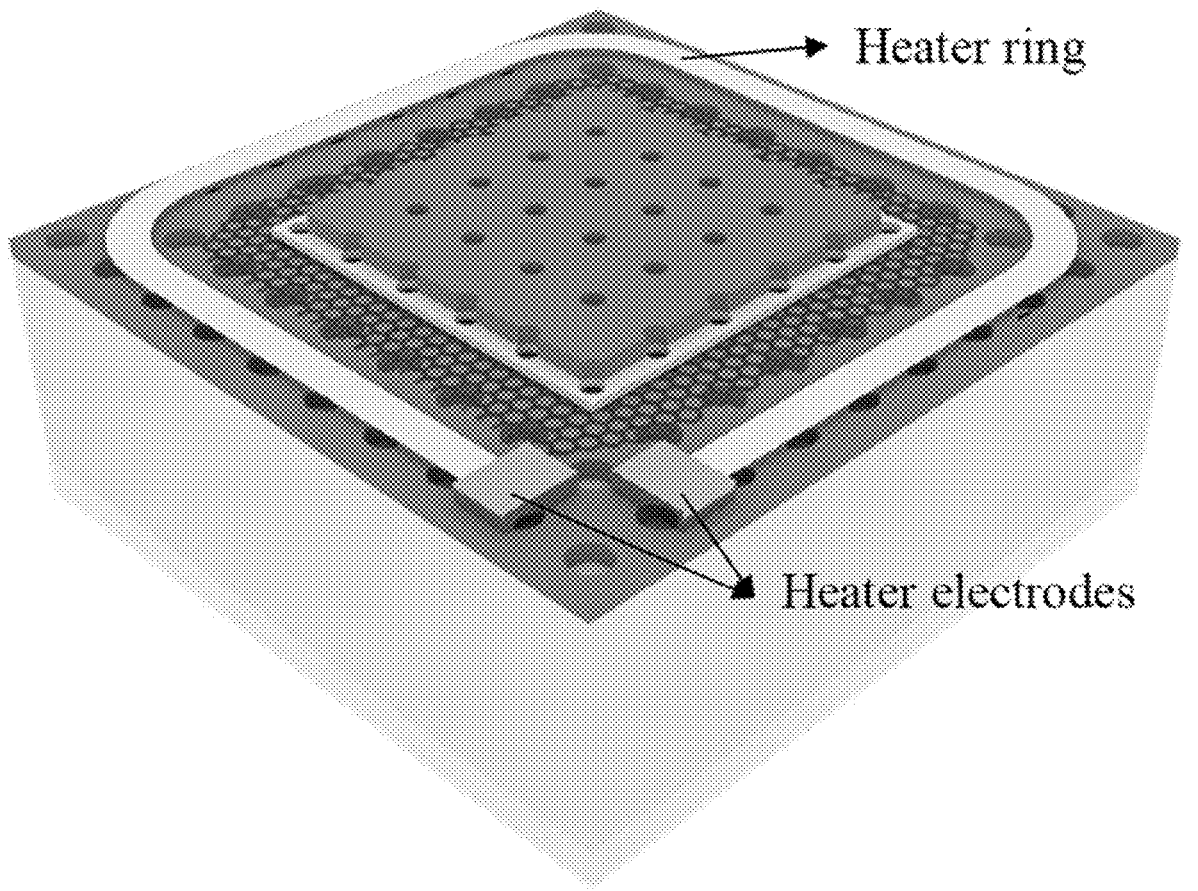
FIG. 20 illustrates a schematic view of a thermo-optically switchable double-layer PCS-graphene absorption system, according to one embodiment described herein

FIG. 20 represents a thermo-optically switchable double-layer PCS-graphene absorption system. The embodiments of FIG. 20 include a heater ring with heater electrodes. The heater electrodes can be electrically coupled to a heater that is operated by a computing device (e.g. a controller). Accordingly, the reflective index (e.g., switching between total absorption and total reflection) can be modulated by a heater. The heater can represent material where current is applied to raise the temperature of the material. The heater can be operated to room temperature, to 100's degrees, and other suitable temperature.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

Therefore, the following is claimed:

1. An optical phased array structure, comprising:
   a vertical cavity surface-emitting laser (VCSEL) that provides a light beam;
   a phase delay unit that includes a bi-layer photonic crystal slab, wherein the bi-layer photonic crystal slab (PCS) is attached to the VCSEL and comprises two silicon PCS layers separated by a dielectric layer; and
   wherein the optical phased array structure is configured to control a direction of the light beam by a voltage applied to the phase delay unit.

2. The optical phased array structure of claim 1, wherein the dielectric layer comprises silicon dioxide.

3. The optical phased array structure of claim 1, wherein a phase of the light beam at a wavelength is controlled based at least in part on electrical control of an optical refractive index of silicon layers.

4. The optical phased array structure of claim 1, wherein the optical phased array structure is a planar device.

5. The optical phased array structure of claim 1, wherein the optical phased array structure is configured for a 21 phase control at least 1 GHz speed.

6. The optical phased array structure of claim 1, wherein the two silicon PCS layers comprises a top p-doped silicon layer and a bottom n-doped silicon layer.

7. The optical phased array structure of claim 1, wherein the phase delay unit comprises a membrane reflector based on Fano resonance.

8. The optical phased array structure of claim 1, wherein the voltage is applied across the two silicon PCS layers of the bi-layer photonic crystal slab.

9. The optical phased array structure of claim 8, wherein the voltage applied to the two silicon PCS layers changes a refractive index of the two silicon PCS layers.

10. The optical phased array structure of claim 9, wherein the dielectric layer has a thickness in a range between 10 nm and 25 nm.

* * * * *